US007190180B2

(12) United States Patent
Yamada et al.

(10) Patent No.: US 7,190,180 B2

(45) Date of Patent: Mar. 13, 2007

(54) ANISOTROPIC CONDUCTIVE CONNECTOR AND PRODUCTION METHOD THEREFOR AND INSPECTION UNIT FOR CIRCUIT DEVICE

(75) Inventors: Daisuke Yamada, Saitama (JP); Kiyoshi Kimura, Saitama (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/525,799

(22) PCT Filed: Jan. 15, 2004

(86) PCT No.: PCT/JP2004/000238

§ 371 (c)(1), (2), (4) Date: Feb. 25, 2005

(87) PCT Pub. No.: WO2004/066449

PCT Pub. Date: Aug. 5, 2004

(65) Prior Publication Data

US 2005/0258850 A1 Nov. 24, 2005

(30) Foreign Application Priority Data

Jan. 17, 2003 (JP) ............................ 2003-010075

(51) Int. Cl.
*G01R 1/073* (2006.01)
*H01R 43/00* (2006.01)

(52) U.S. Cl. ......................... 324/754; 439/91; 439/66; 29/825; 29/744

(58) Field of Classification Search .................... None
See application file for complete search history.

(56) References Cited

U.S. PATENT DOCUMENTS

| | | | | |
|---|---|---|---|---|
| 4,209,481 | A * | 6/1980 | Kashiro et al. | 264/437 |
| 4,778,950 | A * | 10/1988 | Lee et al. | 174/35 GC |
| 5,163,837 | A * | 11/1992 | Rowlette, Sr. | 439/91 |
| 6,453,553 | B1 * | 9/2002 | Caillat et al. | 29/884 |
| 6,720,787 | B2 * | 4/2004 | Kimura et al. | 324/765 |
| 6,969,622 | B1 * | 11/2005 | Kokubo et al. | 438/14 |
| 2002/0060583 | A1 * | 5/2002 | Kimura et al. | 324/765 |
| 2005/0106907 | A1 * | 5/2005 | Yamada et al. | 439/91 |
| 2005/0258850 | A1 | 11/2005 | Yamada et al. | |

FOREIGN PATENT DOCUMENTS

JP 10-197597 7/1998

(Continued)

OTHER PUBLICATIONS

U.S. Appl. No. 10/560,347, filed Dec. 12, 2005, Yamada et al.

*Primary Examiner*—Ernest Karlsen
*Assistant Examiner*—Richard Isla-Rodas
(74) *Attorney, Agent, or Firm*—Oblon, Spivak, McClelland, Maier & Neustadt, P.C.

(57) ABSTRACT

An anisotropically conductive connector, inhibits permanent deformation by contact of target electrodes to be connected with pressure and deformation by abrasion from occurring even if the target electrodes to be connected are those projected, achieves stable conductivity over a long period of time even when it is pressed repeatedly, and prevents or inhibits an object of connection from adhering, a production process thereof, and an inspection apparatus for circuit devices equipped with the anisotropically conductive connector. The anisotropically having an anisotropically conductive film, in which a plurality of conductive path-forming parts each extending in a thickness-wise direction of the film are arranged in a state mutually insulated by insulating parts. The anisotropically conductive film is formed by an insulating elastic polymeric substance, conductive particles exhibiting magnetism are contained in the conductive path-forming parts, and a reinforcing material formed of insulating mesh or nonwoven fabric is contained in a surface layer portion on one surface side of the anisotropically conductive film.

12 Claims, 18 Drawing Sheets

FOREIGN PATENT DOCUMENTS

| | | |
|---|---|---|
| JP | 10-206493 | 8/1998 |
| JP | 2000-156119 | 6/2000 |
| JP | 2000-243485 | 9/2000 |
| JP | 2000-292485 | 10/2000 |
| JP | 2001-283996 | 10/2001 |
| JP | 2002-158051 | 5/2002 |
| JP | 2002-170608 | 6/2002 |
| JP | 2002-289277 | 10/2002 |

* cited by examiner (a)

(b)

ANISOTROPIC CONDUCTIVE CONNECTOR AND PRODUCTION METHOD THEREFOR AND INSPECTION UNIT FOR CIRCUIT DEVICE

TECHNICAL FIELD

The present invention relates to an anisotropically conductive connector suitable for use in, for example, inspection of circuit devices such as semiconductor integrated circuits and a production process thereof, and an inspection apparatus for circuit devices, which is equipped with this anisotropically conductive connector, and particularly to an anisotropically conductive connector suitable for use in inspection of circuit devices such as semiconductor integrated circuits having protruding electrodes such as solder ball electrodes and a production process thereof, and an inspection apparatus for circuit devices.

BACKGROUND ART

An anisotropically conductive sheet is a sheet exhibiting conductivity only in its thickness-wise direction or having pressure-sensitive conductive conductor parts exhibiting conductivity only in the thickness-wise direction when they are pressed in the thickness-wise direction. Since the anisotropically conductive sheet has such features that compact electrical connection can be achieved without using any means such as soldering or mechanical fitting, and that soft connection is feasible with mechanical shock or strain absorbed therein, it is widely used as an anisotropically conductive connector for achieving electrical connection between circuit devices, for example, electrical connection between a printed circuit board and a leadless chip carrier, liquid crystal panel or the like, in fields of, for example, electronic computers, electronic digital clocks, electronic cameras and computer key boards.

On the other hand, in electrical inspection of circuit devices such as printed circuit boards and semiconductor integrated circuits, in order to achieve electrical connection between, for example, electrodes to be inspected formed on one surface of a circuit device, which is an object of inspection, and electrodes for inspection formed on the surface of a circuit board for inspection, it is conducted to cause an anisotropically conductive sheet to intervene, as a connector, between an electrode region of the circuit device and an electrode region for inspection of the circuit board for inspection.

As such anisotropically conductive sheets, there have heretofore been known those of various structures, such as those obtained by uniformly dispersing metal particles in an elastomer (see, for example, the following Prior Art 1), those obtained by unevenly distributing a conductive magnetic metal in an elastomer, thereby forming a great number of conductive path-forming parts each extending in a thickness-wise direction thereof and insulating parts for mutually insulating them (see, for example, the following Prior Art 2) and those obtained by defining a difference in level between the surface of each conductive path-forming part and an insulating part (see, for example, the following Prior Art 3).

In these anisotropically conductive sheets, conductive particles are contained in an insulating elastic polymeric substance in a state oriented so as to align in the thickness-wise direction, and each conductive path is formed by a chain of a great number of conductive particles.

Such an anisotropically conductive sheet can be produced by charging a molding material with conductive particles exhibiting magnetism contained in a polymeric substance-forming material, which will become an elastic polymeric substance by, for example, curing, into a molding cavity of a mold to form a molding material layer and applying a magnetic field thereto to conduct a curing treatment.

However, the following problems are involved when a conventional anisotropically conductive sheet is used as a connector in electrical inspection of a circuit device having protruding electrodes composed of, for example, a solder such as solder ball electrodes.

Namely, when electrical inspection is continuously conducted as to a great number of circuit devices, an operation that protruding electrodes, which are electrodes to be inspected of a circuit device that is an object of inspection, are brought into contact under pressure with the surface of the anisotropically conductive sheet is repeated many times. Therefore, permanent deformation by the contact of the protruding electrodes with pressure, and deformation by abrasion occur on the surface of the anisotropically conductive sheet, and so the electric resistance values of the conductive path-forming parts in the anisotropically conductive sheet are increased, and the electric resistance values of the respective conductive path-forming parts vary, thereby causing a problem that inspection of the following circuit devices becomes difficult.

In addition, particles with a coating layer composed of gold formed thereon are generally used as conductive particles for forming the conductive path-forming parts for the purpose of achieving good conductivity. However, an electrode material (solder) forming electrodes to be inspected in circuit devices migrates to the coating layers on the conductive particles in the anisotropically conductive sheet when electrical inspection of a great number of circuit devices is conducted continuously, whereby the coating layers are modified. As a result, a problem that the conductivity of the conductive path-forming parts is lowered arises.

In order to solve the above-described problems, it is conducted in inspection of circuit devices to form a jig for inspection of circuit devices by an anisotropically conductive sheet and a sheet-like connector obtained by arranging, in a flexible insulating sheet composed of a resin material, a plurality of metallic electrode structures each extending through in a thickness-wise direction of the insulating sheet, and bring electrodes to be inspected into contact under pressure with the metallic electrode structures of the sheet-like connector in the jig for inspection of circuit devices, thereby achieving electrical connection with a circuit device that is an object of inspection (see, for example, Prior Art 4).

In the jig for inspection of circuit devices, however, it is difficult to achieve necessary electrical connection to the circuit device, which is the object of inspection, when the pitch of the electrodes to be inspected of the circuit device is small, i.e., the pitch of the metallic electrode structures in the sheet-like connector is small. Specifically described, adjacent metallic electrode structures interfere with each other in the sheet-like connector small in the pitch of the metallic electrode structures, whereby the flexibility between the adjacent metallic electrode structures is lowered. Therefore, the metallic electrode structures in the sheet-like connector cannot be surely brought into contact with all the electrodes to be inspected in the circuit device, which is the object of inspection, when the circuit device is such that the surface accuracy of a substrate thereof is low, the evenness of thickness of the substrate is low, or a scatter of height of the electrodes to be inspected is wide. As a result, good electrical connection to such a circuit device cannot be achieved.

Even if a good electrically connected state to all the electrodes to be inspected can be achieved, considerably great pressing force is required to bring the metallic electrode structures into contact under pressure with the electrodes to be inspected, so that the following problems are involved. The whole inspection apparatus including a pressing mechanism for bringing the metallic electrode structures into contact under pressure with the electrodes to be inspected becomes a large scale, the production cost of the whole inspection apparatus becomes high, and moreover considerably great pressing force is applied to the anisotropically conductive sheet, whereby the service life of the anisotropically conductive sheet becomes short.

In a test, in which the inspection of the circuit device is conducted under a high-temperature environment, for example, a burn-in test, positional deviation occurs between the conductive path-forming parts of the anisotropically conductive sheet and the metallic electrode structures of the sheet-like connector due to a difference between the coefficient of thermal expansion of an elastic polymeric substance forming the anisotropically conductive sheet and the coefficient of thermal expansion of a resin material forming the insulating sheet in the sheet-like connector. As a result, it is difficult to stably retain the good electrically connected state.

In the case where the jig for inspection of circuit devices is formed, it is necessary to produce the sheet-like connector in addition to the production of the anisotropically conductive sheet. It is also necessary to fix these members in a state aligned to each other, so that the production cost of the whole apparatus necessary for the inspection becomes high.

Further, conventional anisotropically conductive sheets involve the following problems.

Namely, an elastic polymeric substance forming an anisotropically conductive sheet, for example, silicone rubber, has adhesive property at a high temperature, so that the anisotropically conductive sheet formed by such an elastic polymeric substance tends to adhere to a circuit device when it is left to stand for a long period of time in a state pressurized by the circuit device under a high-temperature environment. When permanent deformation is caused on the conductive path-forming parts in the anisotropically conductive sheet by bringing them into contact under pressure with the protruding electrodes and the elastic force of the conductive path-forming parts is lowered, the circuit device is not easily separated from the anisotropically conductive sheet, so that the work of exchanging the circuit device after completion of the inspection to an uninspected circuit device cannot be smoothly conducted. As a result, inspection efficiency of circuit devices is lowered. When the anisotropically conductive sheet adheres to the circuit device in great strength in particular, it is difficult to separate the circuit device from the anisotropically conductive sheet without damaging the anisotropically conductive sheet. Therefore, such an anisotropically conductive sheet cannot be used in the following inspection.

Prior Art 1: Japanese Patent Application Laid-Open No. 93393/1976;

Prior Art 2: Japanese Patent Application Laid-Open No. 147772/1978;

Prior Art 3: Japanese Patent Application Laid-Open No. 250906/1986;

Prior Art 4: Japanese Patent Application Laid-Open No. 231019/1995.

DISCLOSURE OF THE INVENTION

The present invention has been made on the basis of the foregoing circumstances and has as its first object the provision of an anisotropically conductive connector, which inhibits permanent deformation by the contact of the target electrodes to be connected with pressure and deformation by abrasion from occurring even if the target electrodes to be connected with pressure are those projected, achieves stable conductivity over a long period of time even when it is pressed repeatedly, and can prevent or inhibit an object of connection from adhering.

A second object of the present invention is to provide an anisotropically conductive connector, which is suitable for use in electrical inspection of circuit devices, inhibits permanent deformation by the contact of the electrodes to be inspected in a circuit device with pressure and deformation by abrasion from occurring even if the electrodes to be inspected of the circuit device are those projected, and achieves stable conductivity over a long period of time even when it is pressed repeatedly.

A third object of the present invention is to provide an anisotropically conductive connector with which a migration of an electrode material of electrodes to be inspected to conductive particles is prevented or inhibited, and achieves stable conductivity over a long period of time and can be prevented or inhibited from adhering to a circuit device even when the connector is used in a state brought into contact under pressure with the circuit device under a high-temperature environment, in addition to the second object.

A fourth object of the present invention is to provide a process for advantageously producing the above-described anisotropically conductive connectors.

A fifth object of the present invention is to provide an inspection apparatus for circuit devices, which is equipped with any one of the above-described anisotropically conductive connectors.

According to the present invention, there is provided an anisotropically conductive connector comprising an anisotropically conductive film, in which a plurality of conductive path-forming parts each extending in a thickness-wise direction of the film are arranged in a state mutually insulated by insulating parts, wherein the anisotropically conductive film is formed by an insulating elastic polymeric substance, conductive particles exhibiting magnetism are contained in the conductive path-forming parts, and a reinforcing material formed of insulating mesh or nonwoven fabric is contained in a surface layer portion on one surface side of the anisotropically conductive film.

In the anisotropically conductive connector according to the present invention, it may be preferable that the reinforcing material be formed of mesh, and supposing that an opening diameter of the mesh is r1, and an average particle diameter of the conductive particles is r2, a ratio r1/r2 be at least 1.5.

In the anisotropically conductive connector according to the present invention, it may also be preferable that the reinforcing material be formed of mesh, and the opening diameter of the mesh be at most 500 μm.

In the anisotropically conductive connector according to the present invention, it may further be preferable that a supporting body for supporting a peripheral edge portion of the anisotropically conductive film be provided.

The anisotropically conductive connector according to the present invention may preferably be an anisotropically conductive connector suitable for use in conducting electrical connection between electrodes to be inspected of a circuit device, which is an object of inspection, and inspection electrodes of a circuit board for inspection by being intervened between the circuit device and the circuit board for inspection, wherein a reinforcing material composed of insulating mesh or nonwoven fabric is contained in a surface layer portion, with which the circuit device comes into contact, on one surface side of the anisotropically conductive film in such an anisotropically conductive connector.

In the anisotropically conductive connector described above, particles exhibiting neither conductivity nor magnetism may preferably be contained in the surface layer portion, with which the circuit device comes into contact, on one surface side of the anisotropically conductive film, and the particles exhibiting neither conductivity nor magnetism may more preferably be diamond powder.

In the anisotropically conductive connector described above, conductive path-forming parts, which are not electrically connected to the electrodes to be inspected of the circuit device that is the object of inspection, may also be formed in the anisotropically conductive film in addition to the conductive path-forming parts electrically connected to the electrodes to be inspected, and the conductive path-forming parts, which are not electrically connected to the electrodes to be inspected of the circuit device that is the object of inspection, may also be formed at least at the peripheral edge portion of the anisotropically conductive film supported by the supporting body.

In the anisotropically conductive connector described above, the conductive path-forming parts may also be arranged at a fixed pitch.

According to the present invention, there is provided a process for producing an anisotropically conductive connector having an anisotropically conductive film, in which a plurality of conductive path-forming parts each extending in a thickness-wise direction of the film are arranged in a state mutually insulated by insulating parts, which comprises the steps of:

providing a mold for molding the anisotropically conductive film, the molding cavity of which is formed by a pair of faces, forming, on a molding surface of one face a molding material layer obtained by incorporating a reinforcing material composed of insulating mesh or nonwoven fabric and conductive particles exhibiting magnetism into a liquid polymeric substance-forming material, which will become an elastic polymeric substance by curing, and forming, on a molding surface of the other face, a molding material layer obtained by incorporating conductive particles into a liquid polymeric substance-forming material, which will become an elastic polymeric substance by curing, and stacking the molding material layer formed on the molding surface of said one face and the molding material layer formed on the molding surface of the other face, thereafter applying a magnetic field having an intensity distribution to the thickness-wise directions of the respective molding material layers, and subjecting the molding material layers to a curing treatment, thereby forming the anisotropically conductive film.

According to the present invention, there is provided an inspection apparatus for circuit devices, comprising a circuit board for inspection having inspection electrodes arranged correspondingly to electrodes to be inspected of a circuit device, which is an object of inspection, and any one of the above-described anisotropically conductive connectors, which is arranged on the circuit board for inspection.

In the inspection apparatus for circuit devices according to the present invention, a pressurizing force-relaxing frame for relaxing the pressurizing force of the electrodes to be inspected against the anisotropically conductive film of the anisotropically conductive connector may preferably be arranged between the circuit device, which is the object of inspection, and the anisotropically conductive connector, and the pressurizing force-relaxing frame may preferably have spring elasticity or rubber elasticity.

EFFECTS OF THE INVENTION

According to the anisotropically conductive connectors of the present invention, the reinforcing material formed of insulating mesh or nonwoven fabric is contained in the surface layer portion on one surface side of the anisotropically conductive film, so that the anisotropically conductive connectors can inhibit permanent deformation by the contact of the target electrodes to be connected with pressure and deformation by abrasion from occurring even if the target electrodes to be connected are those projected. In addition, since the reinforcing material is not present at other portions than the surface layer portion on one surface side of the anisotropically conductive film, the elasticity that the elastic polymeric substance itself forming the anisotropically conductive film has is fully exhibited when the conductive path-forming parts are pressurized. As a result, necessary conductivity can be surely achieved. Accordingly, stable conductivity can be achieved over a long period of time even when the conductive path-forming parts are pressed repeatedly by the target electrodes to be connected.

Since the permanent deformation of the conductive path-forming parts by the contact of the target electrodes to be connected with pressure is small, and the elastic force thereof is stably retained over a long period of time, adhesion of the object of connection can be surely prevented or inhibited.

Since the particles exhibiting neither conductivity nor magnetism are contained in the surface layer portion on one surface side, whereby the hardness of the surface layer portion on one surface side is increased. Therefore, occurrence of the permanent deformation by the contact of the target electrodes to be connected with pressure and deformation by abrasion can be more inhibited, and moreover the migration of the electrode material to the conductive particles in the anisotropically conductive film is prevented or inhibited, so that more stable conductivity can be achieved over a long period of time, and the anisotropically conductive connector can be prevented or inhibited from adhering to a circuit device even when it is used in a state brought into contact under pressure with the circuit device under a high-temperature environment in the electrical inspection of the circuit device.

According to the production process of the anisotropically conductive connector of the present invention, the molding material layer containing the reinforcing material, formed on the molding surface of one face and the molding material layer formed on the molding surface of the other face are stacked, and the respective molding material layers are subjected to a curing treatment in this state, so that an anisotropically conductive connector having a anisotropically conductive film containing the reinforcing material at only the surface layer portion on one surface side can be advantageously and surely produced.

According to the inspection apparatus for circuit devices of the present invention, the above-described anisotropically conductive connector is provided, so that occurrence of permanent deformation by the contact of electrodes to be inspected with pressure and deformation by abrasion is inhibited even if the electrodes to be inspected are those projected, and so stable conductivity can be achieved over a long period of time even when inspection is conducted continuously as to a great number of circuit devices, and moreover the fact that the circuit device adheres to the anisotropically conductive connector can be surely prevented or inhibited.

According to the inspection apparatus for circuit devices of the present invention, since the use of sheet-like connector in addition to the anisotropically conductive connector becomes unnecessary, positioning between the anisotropically conductive connector and the sheet-like connector is unnecessary, so that the problem of positional deviation between the sheet-like connector and the anisotropically conductive connector due to temperature change can be avoided, and moreover the constitution of the inspection apparatus becomes easy.

The pressurizing force-relaxing frame is provided between a circuit device, which is an object of inspection, and the anisotropically conductive connector, whereby the pressurizing force of the electrodes to be inspected against the anisotropically conductive film of the anisotropically conductive connector is relaxed, so that stable conductivity can be achieved over a longer period of time.

The frame having spring elasticity or rubber elasticity is used as the pressurizing force-relaxing frame, whereby the intensity of shock applied to the anisotropically conductive film by the electrodes to be inspected can be reduced. Therefore, breaking or any other trouble of the anisotropically conductive film can be prevented or inhibited, and the circuit device can be easily separated from the anisotropically conductive film by the spring elasticity of the pressurizing force-relaxing frame when the pressurizing force against the anisotropically conductive film is released, so that the work of exchanging the circuit device after completion of the inspection to an uninspected circuit device can be smoothly conducted. As a result, inspection efficiency of circuit devices can be improved.

DESCRIPTION OF CHARACTERS

1 Circuit device,
2 Solder ball electrodes,
3 Circuit device for test,
5 Circuit board for inspection,
6 Inspection electrodes,
7 Thermostatic chamber,
8 Wiring,
9 Guide pins,
10 Anisotropically conductive connector,
10A Anisotropically conductive film,
10B Surface layer portion on one surface side,
10C Another layer portion,

10D Surface layer portion on the other surface side,
10E Intermediate layer portion,
11 Conductive path-forming parts,
11*a* Projected portions,
12 Effective conductive path-forming parts,
13 Non-effective conductive path-forming parts,
15 Insulating parts,
16 Recess,
17 Through-hole,
50 Top face,
51 Ferromagnetic substance substrate,
52 Ferromagnetic substance layers,
53 Non-magnetic substance layers,
53*a*, 53*b* Portions of non-magnetic substance layer
54*a*, 54*b* Spacers,
55 Bottom face,
56 Ferromagnetic substance substrate,
57 Ferromagnetic substance layers,
57*a* Recessed portions,
58 Non-magnetic substance layers,
59 Molding cavity,
60 Recess,
61*a* First molding material layer,
61*b* Second molding material layer,
65 Pressurizing force-relaxing frame,
66 Opening,
67 Leaf spring part,
68 Positioning holes,
71 Supporting body,
72 Positioning holes,
73 Opening,
110 Voltmeter,
115 DC power source,
116 Constant-current controller.

BEST MODE FOR CARRYING OUT THE INVENTION

The embodiments of the present invention will hereinafter be described in details.

The embodiments of the present invention will hereinafter be described in details.

Figure 1:
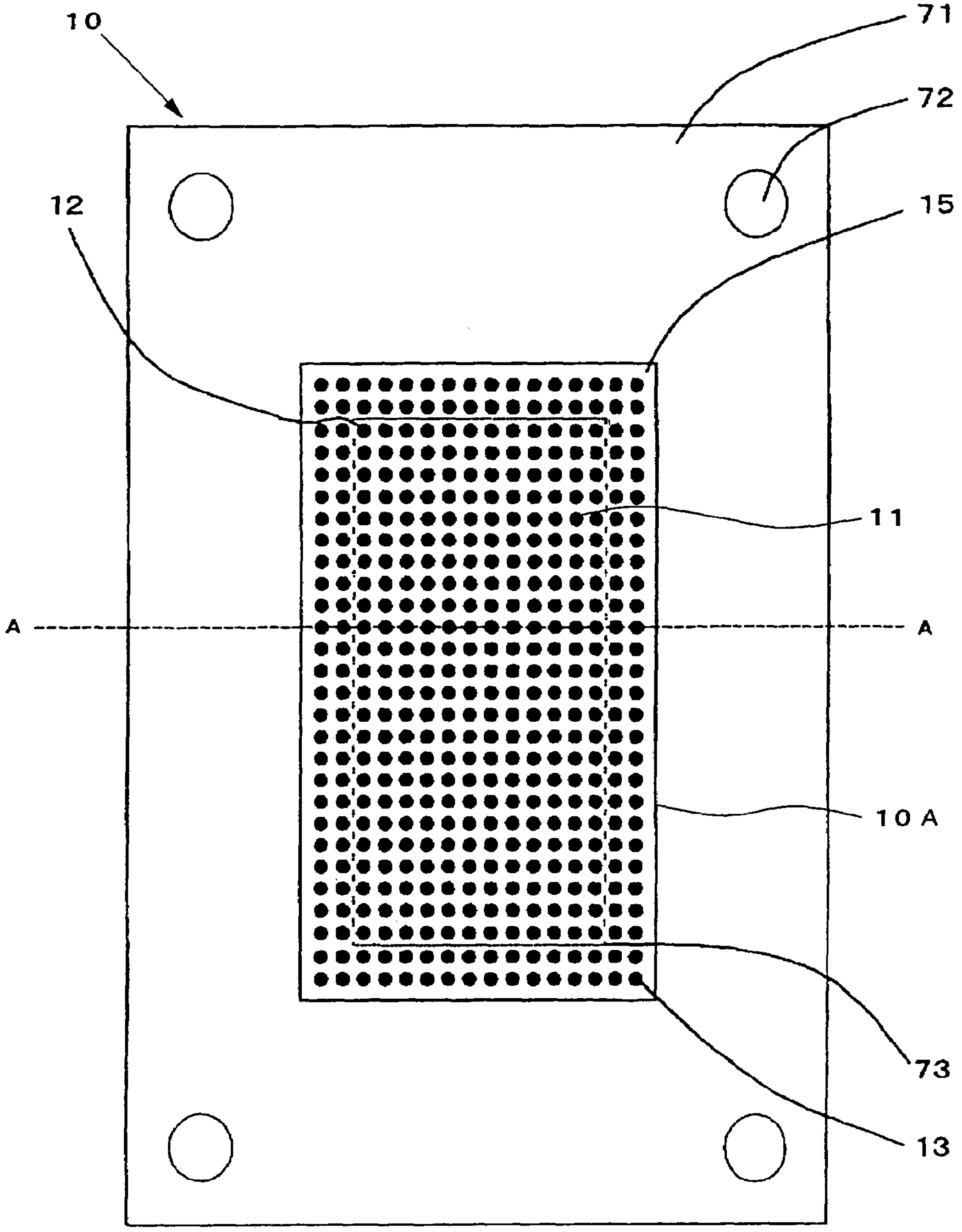
FIG. 1 is a plan view illustrating an exemplary anisotropically conductive connector according to the present invention.
Figure 2:
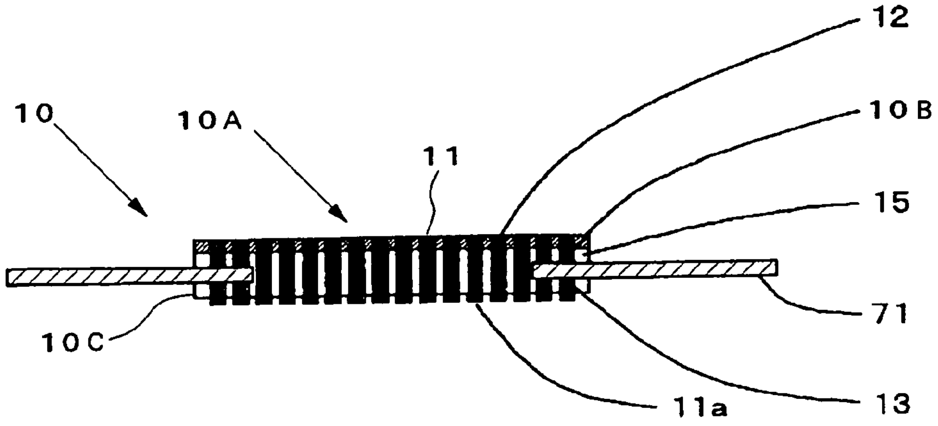
FIG. 2 is a cross-sectional view taken along line A—A of the anisotropically conductive connector shown in FIG. 1.
Figure 3:
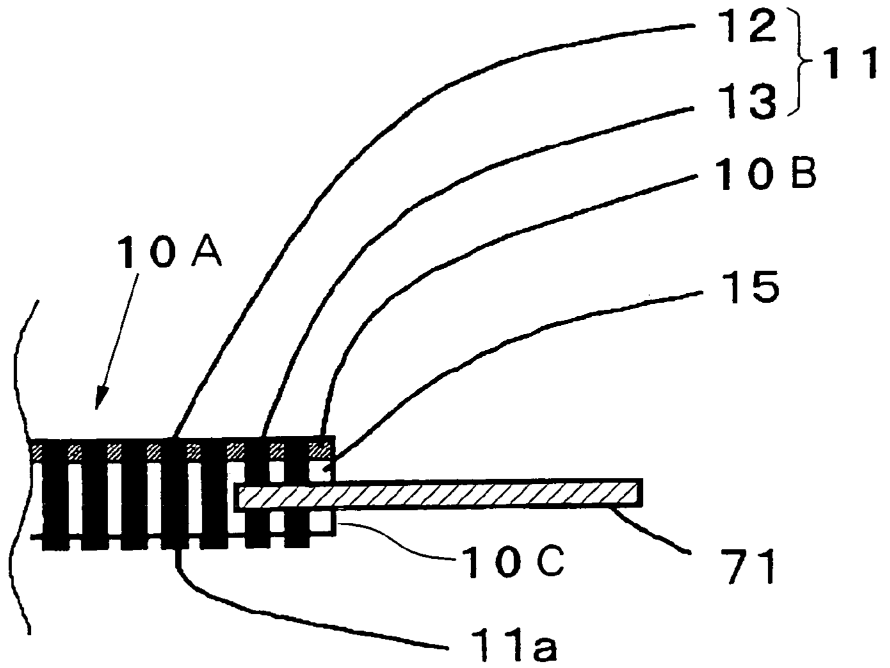
FIG. 3 is a cross-sectional view illustrating, on an enlarged scale, a part of the anisotropically conductive connector shown in FIG. 1.

FIGS. 1, 2 and 3 illustrate the construction of an exemplary anisotropically conductive connector according to the present invention, wherein FIG. 1 is a plan view, FIG. 2 is a cross-sectional view taken along line A—A in FIG. 1, and FIG. 3 is a partially enlarged cross-sectional view. This anisotropically conductive connector 10 is constructed by a rectangular anisotropically conductive film 10A and a rectangular plate-like supporting body 71 for supporting the anisotropically conductive film 10A and is formed in the form of a sheet as a whole.

Figure 4:
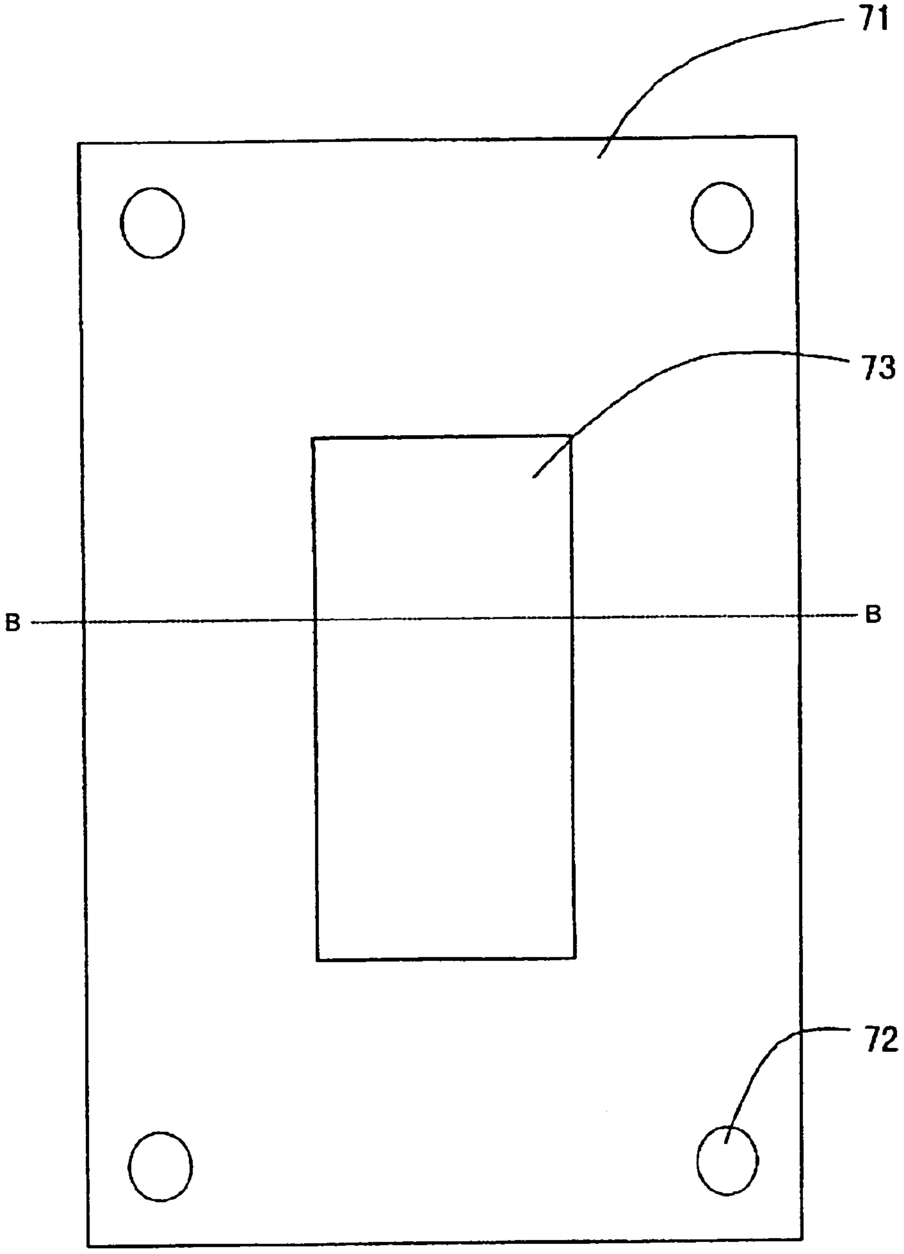
FIG. 4 is a plan view of a supporting body in the anisotropically conductive connector shown in FIG. 1.
Figure 5:
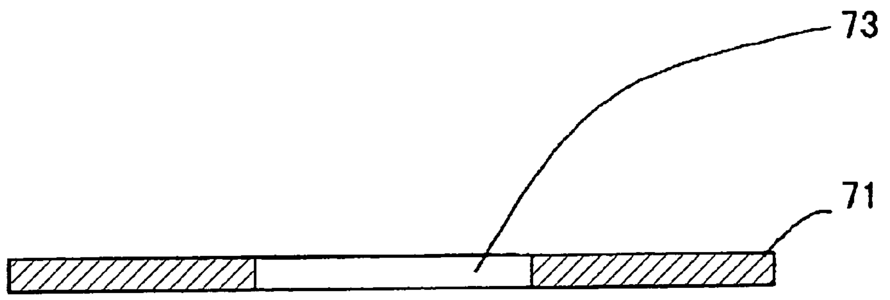
FIG. 5 is a cross-sectional view taken along line B—B of the supporting body shown in FIG. 4.

As also illustrated in FIGS. 4 and 5, a rectangular opening 73 smaller in size than the anisotropically conductive film 10A is formed at a central position of the supporting body 71, and positioning holes 72 are respectively formed at 4 corner positions. The anisotropically conductive film 10A is arranged at the opening 73 of the supporting body 71, and a peripheral edge portion of the anisotropically conductive film 10A is fixed to the supporting body 71, thereby being supported by the supporting body 71.

The anisotropically conductive film 10A in this anisotropically conductive connector 10 is composed of a plurality of columnar conductive path-forming parts 11 each extending in a thickness-wise direction thereof and insulating parts 15 for mutually insulating these conductive path-forming parts 11.

The anisotropically conductive film 10A is formed by an insulating elastic polymeric substance as a whole, and conductive particles (not illustrated) exhibiting magnetism are contained in the conductive path-forming parts 11 thereof in a state oriented so as to align in the thickness-wise direction of the film. On the other hand, the conductive particles are not contained at all or scarcely contained in the insulating parts 15.

A reinforcing material (not illustrated) formed of insulating mesh or nonwoven fabric is contained in a surface layer portion (hereinafter referred to as "surface layer portion on one surface side") 10B on one surface side (upper surface side in the drawings) of the anisotropically conductive film 10A. On the other hand, no reinforcing material is present in another portion (hereinafter referred to as "another layer portion") 10C than the surface layer portion 10B on one surface side of the anisotropically conductive film 10A.

In the embodiment illustrated, those formed in another region than the peripheral edge portion in the anisotropically conductive film 10A among the plurality of the conductive path-forming parts 11 serve as effective conductive path-forming parts 12 electrically connected to the target electrodes to be connected, for example, electrodes to be inspected in a circuit device 1, which is an object of inspection, and those formed in the peripheral edge portion in the anisotropically conductive film 10A serve as non-effective conductive path-forming parts 13 that are not electrically connected to the target electrodes to be connected. The effective conductive path-forming parts 12 are arranged in accordance with a pattern corresponding to a pattern of the target electrodes to be connected.

On the other hand, the insulating parts 15 are integrally formed so as to surround the individual conductive path-forming parts 11, whereby all the conductive path-forming parts 11 are in a state mutually insulated by the insulating parts 15.

In the anisotropically conductive connector 10 of this embodiment, a surface of the anisotropically conductive film 10A, i.e., the surface of the surface layer portion 10B on one surface side is flatly formed, while projected portions 11*a* that the surface of the conductive path-forming parts 11 project from the surface of the insulating part 15 are formed on the other side of the anisotropically conductive film 10A.

Particles (hereinafter referred to as "non-magnetic insulating particles") exhibiting neither magnetism nor conductivity are contained in the surface layer portion 10B on one surface side of the anisotropically conductive film 10A.

The durometer A hardness of an elastic polymeric substance forming the anisotropically conductive film 10A is preferably 15 to 70, more preferably 25 to 65. If the durometer A hardness is too low, high repetitive durability may not be achieved in some cases. If the durometer A hardness is too high on the other hand, conductive path-forming parts having high conductivity may not be obtained in some cases.

The elastic polymeric substance forming the anisotropically conductive film 10A is preferably a polymeric substance having a crosslinked structure. As curable polymeric substance-forming materials usable for obtaining such an elastic polymeric substance, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber and ethylene-propylene-diene terpolymer rubber.

When weather resistance is required of the resulting anisotropically conductive connector 10 in the embodiment described above, any other material than conjugated diene rubbers is preferably used. In particular, silicone rubber is preferably used from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 because good heat resistance is achieved in the resulting conductive path-forming parts 11.

As the conductive particles contained in the conductive path-forming parts 11 in the anisotropically conductive film 10A, those exhibiting magnetism are used in that such conductive particles can be easily oriented by a process, which will be described subsequently. Specific examples of such conductive particles include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, and particles obtained by using particles of a non-magnetic metal, particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold which has good conductivity are preferably used.

No particular limitation is imposed on a means for coating the surfaces of the core particles with the conductive metal. However, for example, a chemical plating, electroplating, sputtering or vapor deposition process is used.

When those obtained by coating the surfaces of the core particles with the conductive metal are used as the conductive particles, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The particle diameter of the conductive particles is preferably 1 to 100 μm, more preferably 2 to 50 μm, still more preferably 3 to 30 μm, particularly preferably 4 to 20 μm.

The particle diameter distribution (Dw/Dn) of the conductive particles is preferably 1 to 10, more preferably 1.01 to 7, still more preferably 1.05 to 5, particularly preferably 1.1 to 4.

When conductive particles satisfying such conditions are used, the resulting conductive path-forming parts 11 become easy to deform under pressure, and sufficient electrical contact is achieved among the conductive particles in the conductive path-forming parts 11.

No particular limitation is imposed on the form of the conductive particles. However, they are preferably in the form of a sphere or star, or secondary particles obtained by aggregating these particles from the viewpoint of permitting easy dispersion of these particles in the polymeric substance-forming material.

Those obtained by treating surfaces of the conductive particles with a coupling agent such as a silane coupling agent, or a lubricant may be suitably used. By treating the surfaces of the particles with the coupling agent or lubricant, the durability of the resulting anisotropically conductive connector is improved.

Such conductive particles are preferably used in a proportion of 5 to 60%, more preferably 7 to 50% in terms of volume fraction to the polymeric substance-forming material. If this proportion is lower than 5%, conductive path-forming parts 11 sufficiently low in electric resistance value may not be obtained in some cases. If the proportion exceeds 60% on the other hand, the resulting conductive path-forming parts 11 are liable to be brittle, so that elasticity required of the conductive path-forming parts 11 may not be achieved in some cases.

As the conductive particles used in the conductive path-forming parts 11, are preferred those having surfaces coated with gold. When the target electrodes to be connected, for example, electrodes to be inspected in a circuit device, which is an object of inspection, are composed of a solder containing lead, however, the conductive particles contained in the surface layer portion 10B on one surface side, with which the electrodes to be inspected composed of the solder come into contact, are preferably coated with a diffusion-resistant metal selected from rhodium, palladium, ruthenium, tungsten, molybdenum, platinum, iridium, silver and alloys containing these metals, whereby diffusion of the lead component into the coating layer of the conductive particles can be prevented.

The conductive particles having surfaces coated with the diffusion-resistant metal can be formed by coating the surfaces of core particles composed of, for example, nickel, iron, cobalt or an alloy thereof, with the diffusion-resistant metal by, for example, a chemical plating, electroplating, sputtering or vapor deposition process.

The coating amount of the diffusion-resistant metal is preferably in a proportion of 5 to 40%, more preferably 10 to 30% in terms of mass fraction to the conductive particles.

As the mesh or nonwoven fabric making up the reinforcing material contained in the surface layer portion 10B on one surface side of the anisotropically conductive film 10A, may preferably be used that formed by organic fiber.

As examples of such organic fiber, may be mentioned fluororesin fibers such as polytetrafluoroethylene fiber, aramide fiber, polyethylene fiber, polyarylate fiber, nylon fiber, and polyester fiber.

In addition, as the organic fiber, that whose coefficient of linear thermal expansion is equivalent or close to that of a material forming the object of connection, specifically, that having a coefficient of linear thermal expansion of $30\times10^{-6}$ to $-5\times10^{-6}$/K, particularly $10\times10^{-6}$ to $-3\times10^{-6}$/K is used, whereby the thermal expansion of the anisotropically conductive film 10A is inhibited, so that a good electrically connected state to the object of connection can be stably retained even when the anisotropically conductive connector is subjected to thermal hysteresis by temperature change.

As the organic fiber, is preferably used that having a diameter of 10 to 200 μm.

Supposing that an opening diameter of the mesh making up the reinforcing material is r1, and an average particle diameter of the conductive particles used is r2, the mesh satisfing a ratio r1/r2 of at least 1.5, more preferably at least 2, still more preferably at least 3, particularly preferably at least 4 is preferred. If this ratio r1/r2 is too low, the conductive particles become difficult to be oriented in the thickness-wise direction in the production process, which will be described subsequently, so that it may be difficult in some cases to obtain conductive path-forming parts small in electric resistance value.

The opening diameter r1 of the mesh is preferably at most 500 μm, more preferably at most 400 μm, particularly preferably at most 300 μm. If the opening diameter r1 is too great, it may be difficult in some cases to obtain an anisotropically conductive connector having high durability.

As the nonwoven fabric making up the reinforcing material, is preferably used that having voids in the interior thereof and produced by using short fiber of the organic fiber described above as a raw material in accordance with a wet papermaking technique.

The thickness of the reinforcing material is preferably 10 to 70% of that of the anisotropically conductive film 10A to be formed. Specifically, the thickness is preferably 50 to 500 μm, more preferably 80 to 400 μm. The thickness of the reinforcing material in the present invention is a value measured by a micrometer.

The reinforcing material is suitably selected in view of easy impregnation of a liquid polymeric substance-forming material, which will be described subsequently, balance between flexibility and dimension stability, and the like. However, that having an opening rate (percentage of voids) of 25 to 75%, more preferably 30 to 60% is preferably used.

As the non-magnetic insulating particles contained in the surface layer portion 10B on one surface side of the anisotropically conductive film 10A, may be used diamond powder, glass powder, ceramic powder, ordinary silica powder, colloidal silica, aerogel silica, alumina or the like. Among these, diamond powder is preferred.

When such non-magnetic insulating particles are contained in the surface layer portion 10B on one surface side, the hardness of the surface layer portion 10B on one surface side becomes still higher, and so high repetitive durability can be achieved, and the diffusion of the lead component making up the electrodes to be inspected into the coating layer of the conductive particles can be prevented. In addition, adhesion of the anisotropically conductive film 10A to a circuit device, which is an object of inspection, can be inhibited.

The particle diameter of the non-magnetic insulating particles is preferably 0.1 to 50 μm, more preferably 0.5 to 40 μm, still more preferably 1 to 30 μm. If the particle diameter is too small, it is difficult to sufficiently impart the effect of inhibiting permanent deformation and deformation by abrasion to the resulting surface layer portion 10B on one surface side. If non-magnetic insulating particles having a too small particle diameter are used in a great amount, the flowability of a molding material for obtaining the surface layer portion 10B on one surface side is deteriorated, so that it may be difficult in some cases to orient the conductive particles in such a molding material by a magnetic field.

If the particle diameter is too great on the other hand, it may be difficult in some cases to obtain conductive path-forming parts 11 low in electric resistance value because such non-magnetic insulating particles are present in the conductive path-forming parts 11.

No particular limitation is imposed on the amount of the non-magnetic insulating particles used. If the amount of the non-magnetic insulating particles used is small, however, the hardness of the surface layer portion 10B on one surface side cannot be increased. If the amount of the non-magnetic insulating particles used is great, it is impossible to sufficiently achieve the orientation of the conductive particles by a magnetic field in the production process, which will be described subsequently. It is hence not preferable to use the non-magnetic insulating particles in such a small or great amount. The practical amount of the non-magnetic insulating particles used is 5 to 90 parts by weight per 100 parts by weight of the elastic polymeric substance forming the surface layer portion 10B on one surface side.

As a material forming the supporting body 71, is preferably used that having a coefficient of linear thermal expansion of at most $3\times10^{-5}$/K, more preferably $2\times10^{-5}$ down to $1\times10^{-6}$/K, particularly preferably $6\times10^{-6}$ down to $1\times10^{-6}$/K.

As such a material, may be used a metallic material or non-metallic material.

As the metallic material, may be used gold, silver, copper, iron, nickel, cobalt or an alloy thereof.

As the non-metallic material, may be used a resin material having high mechanical strength, such as a polyimide resin, polyester resin, polyaramide resin or polyamide resin, a fiber-reinforced resin material such as a glass fiber-reinforced epoxy resin, glass fiber-reinforced polyester resin or glass fiber-reinforced polyimide resin, or a composite resin material with an inorganic material such as silica, alumina or boron nitride mixed as a filler into an epoxy resin or the like. Among these, the polyimide resin, the fiber-reinforced resin material such as the glass fiber-reinforced epoxy resin, or the composite resin material such as an epoxy resin mixed with boron nitride as a filler is preferred in that it is low in coefficient of thermal expansion.

According to the anisotropically conductive connector 10 described above, the reinforcing material formed of the insulating mesh or nonwoven fabric is contained in the surface layer portion 10B on one surface side of the anisotropically conductive film 10A, so that the anisotropically conductive connector can inhibit permanent deformation by the contact of the target electrodes to be connected with pressure and deformation by abrasion from occurring even if the target electrodes to be connected are those projected. In addition, since the reinforcing material is not present at another layer portion 10C in the anisotropically conductive film 10A, the elasticity that the elastic polymeric substance itself forming the anisotropically conductive film 10A has is fully exhibited when the conductive path-forming parts 11 are pressurized. As a result, necessary conductivity can be surely achieved. Accordingly, stable conductivity can be achieved over a long period of time even when the conductive path-forming parts are pressed repeatedly by the target electrodes to be connected.

Since the permanent deformation of the conductive path-forming parts 11 by the contact of the target electrodes to be connected with pressure is small, and the elastic force thereof is stably retained over a long period of time, the fact the object of connection adheres can be surely prevented or inhibited.

Since the particles exhibiting neither conductivity nor magnetism are contained in the surface layer portion 10B on one surface side of the anisotropically conductive film 10A, and so the hardness of the surface layer portion 10B on one surface side is increased, whereby occurrence of the permanent deformation by the contact of the target electrodes to be connected with pressure and deformation by abrasion can be more inhibited, and moreover the migration of the electrode material to the conductive particles is prevented or inhibited, so that more stable conductivity can be achieved over a long period of time, and the anisotropically conductive connector can be prevented or inhibited from adhering to a circuit device even when it is used in a state brought into contact under pressure with the circuit device under a high-temperature environment in the electrical inspection of the circuit device.

Such an anisotropically conductive connector 10 can be produced, for example, in the following manner.

Figure 6:
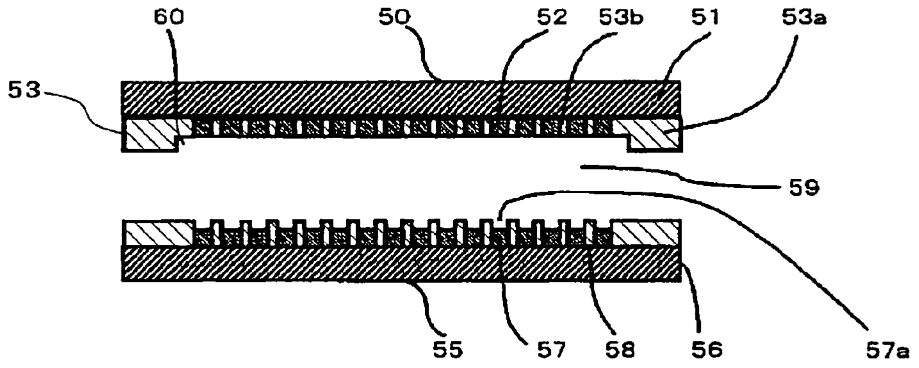
FIG. 6 is a cross-sectional view illustrating the construction of an exemplary mold for molding an anisotropically conductive film.

FIG. 6 is a cross-sectional view illustrating the construction of an exemplary mold used for producing the anisotropically conductive connector according to the present invention. This mold is so constructed that a top face 50 and a bottom face 55 making a pair therewith are arranged so as to be opposed to each other. A molding cavity 59 is defined between a molding surface (lower surface in FIG. 6) of the top face 50 and a molding surface (upper surface in FIG. 6) of the bottom face 55.

In the top face 50 ferromagnetic substance layers 52 are formed in accordance with an arrangement pattern corresponding to a pattern of conductive path-forming parts 11 in the intended anisotropically conductive connector 10 on a surface (lower surface in FIG. 6) of a ferromagnetic substance substrate 51, and non-magnetic substance layers 53 composed of portions 53*b* (hereinafter referred to as "portions 53*b*" merely) having substantially the same thickness as the thickness of the ferromagnetic substance layers 52 and portions 53*a* (hereinafter referred to as "portions 53*a*" merely) having a thickness greater than the thickness of the ferromagnetic substance layers 52 are formed at other places than the ferromagnetic substance layers 52. A difference in level is defined between the portion 53*a* and the portion 53*b* in the non-magnetic substance layers 53, thereby forming a recess 60 in the surface of the top face 50.

In the bottom face 55 on the other hand, ferromagnetic substance layers 57 are formed in accordance with a pattern corresponding to the pattern of the conductive path-forming parts 11 in the intended anisotropically conductive connector 10 on a surface (upper surface in FIG. 6) of the ferromagnetic substance substrate 56, and non-magnetic substance layers 58 having a thickness greater than the thickness of the ferromagnetic substance layers 57 are formed at other places than the ferromagnetic substance layers 57. A difference in level is defined between the non-magnetic substance layer 58 and the ferromagnetic substance layer 57, whereby recessed portions 57*a* for forming projected portions 11*a* in the anisotropically conductive film 10A are formed in the molding surface of the bottom face 55.

As a material for forming the respective ferromagnetic substance substrates 51, 56 in the top face 50 and bottom face 55, may be used a ferromagnetic metal such as iron, iron-nickel alloy, iron-cobalt alloy, nickel or cobalt. The ferromagnetic substance substrates 51, 56 preferably have a thickness of 0.1 to 50 mm, and surfaces thereof are preferably smooth and subjected to a chemical degreasing treatment and/or mechanical polishing treatment.

As a material for forming the respective ferromagnetic substance layers 52, 57 in the top face 50 and bottom face 55, may be used a ferromagnetic metal such as iron, iron-nickel alloy, iron-cobalt alloy, nickel or cobalt. The ferromagnetic substance layers 52, 57 preferably have a thickness of at least 10 μm. If this thickness is smaller than 10 μm, it is difficult to apply a magnetic field having sufficient intensity distribution to the molding material layers formed in the mold. As a result, it is difficult to gather the conductive particles at a high density at portions to become conductive path-forming parts 11 in the molding material layers, and so a good anisotropically conductive connector may not be provided in some cases.

As a material for forming the respective non-magnetic substance layers 53, 58 in the top face 50 and bottom face 55 may be used a non-magnetic metal such as copper, a polymeric substance having heat resistance, or the like. However, a polymeric substance cured by radiation may preferably be used in that the non-magnetic substance layers 53, 58 can be easily formed by a technique of photolithography. As a material thereof, may be used, for example, a photoresist such as an acrylic type dry film resist, epoxy type liquid resist or polyimide type liquid resist.

The thickness of the non-magnetic substance layers 58 in the bottom face 55 is preset according to the projected height of the projected portions 11*a* to be formed and the thickness of the ferromagnetic substance layers 57.

The mold described above is used to produce the anisotropically conductive connector 10, for example, in the following manner.

Figure 7:
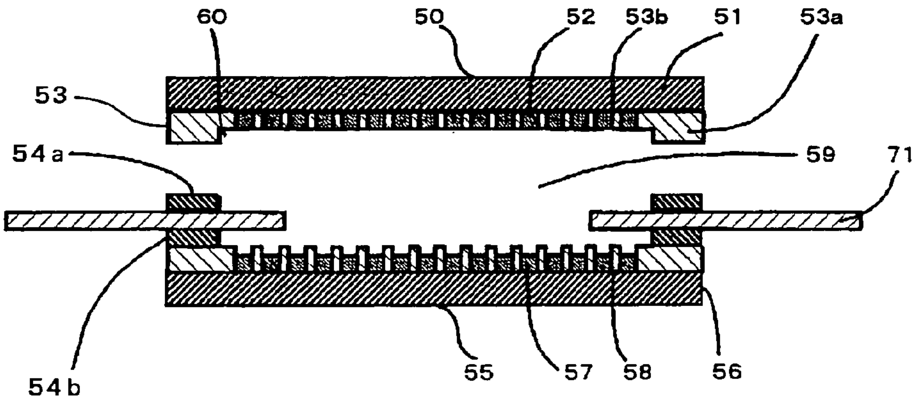
FIG. 7 is a cross-sectional view illustrating a state that spacers and a supporting body have been arranged on the molding surface of a bottom face.

As illustrated in FIGS. 4 and 5, a supporting body 71 having an opening 73 and positioning holes 72 is first provided, and the supporting body 71 is fixed and arranged at a prescribed position of the bottom face 55 through the frame-like spacer 54*b* having an opening at a central position, as illustrated in FIG. 7. Further, the frame-like spacer 54*a* having an opening at a central position is arranged on the supporting body 71.

On the other hand, a first molding material in the form of paste for forming the surface layer portion 10B on one surface side is prepared by dispersing conductive particles exhibiting magnetism and non-magnetic insulating particles in a liquid polymeric substance-forming material, which will become an elastic polymeric substance by curing, and a second molding material in the form of paste for forming the another layer portion 10C is prepared by dispersing conductive particles exhibiting magnetism in a polymeric substance-forming material, which will become an elastic polymeric substance by curing.

Figure 8:
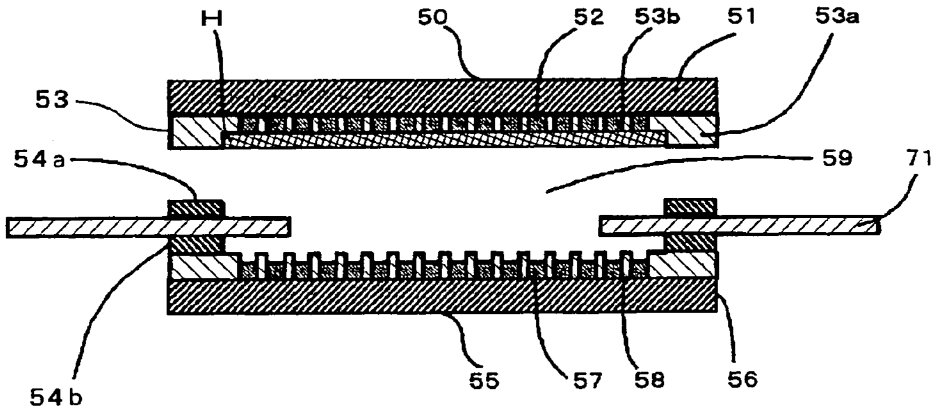
FIG. 8 is a cross-sectional view illustrating a state that a reinforcing material has been arranged on the molding surface of the top face.
Figure 9:
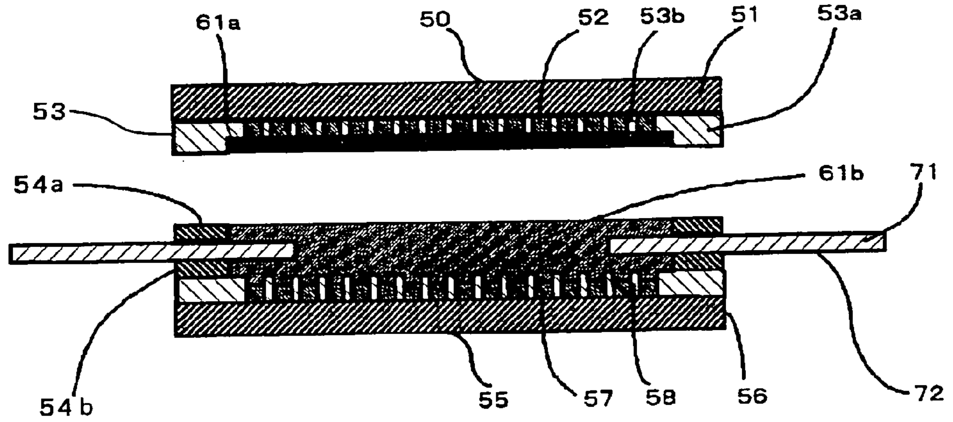
FIG. 9 is a cross-sectional view illustrating a state that a first molding material layer has been formed on the molding surface of a top face and a second molding material layer has been formed on the molding surface of the bottom face.

As illustrated in FIG. 8, a sheet-like reinforcing material H formed of insulating mesh or nonwoven fabric is then arranged in the recess 60 (see FIG. 6) in the molding surface of the top face 50 and the first molding material is further charged into the recess 60, thereby forming a first molding material layer 61*a* with the conductive particles exhibiting magnetism, non-magnetic insulating particles and reinforcing material contained in the polymeric substance-forming material as illustrated in FIG. 9. On the other hand, the second molding material is charged into a cavity defined by the bottom face 55, the spacers 54*a* and 54*b*, and the supporting body 71, thereby forming a second molding material layer 61*b* with the conductive particles exhibiting magnetism contained in the polymeric substance-forming material.

Figure 10:
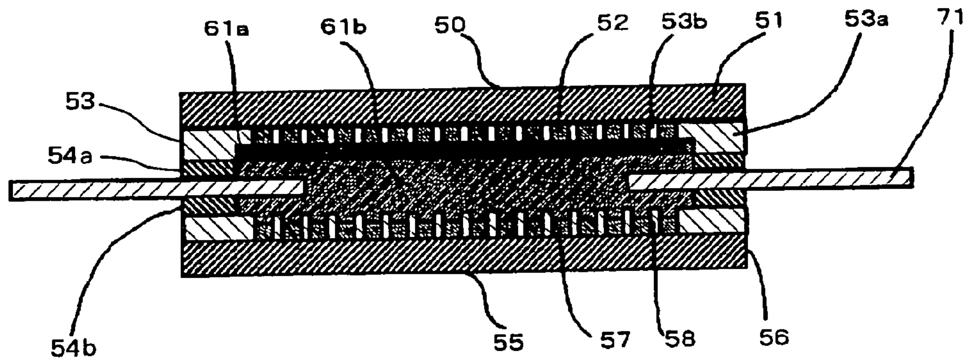
FIG. 10 is a cross-sectional view illustrating a state that the first molding material layer has been laminated on the second molding material layer.

As illustrated in FIG. 10, the top face 50 is arranged in alignment on the spacer 54*a*, whereby the first molding material layer 61*a* is stacked on the second molding material layer 61*b*.

Electromagnets (not illustrated) respectively arranged on an upper surface of the ferromagnetic substance substrate 51 in the top face 50 and a lower surface of the ferromagnetic substance substrate 56 in the bottom face 55 are then operated, whereby a parallel magnetic field having a intensity distribution, i.e., a parallel magnetic field having higher intensity at portions between the ferromagnetic substance layers 52 of the top face 50 and their corresponding ferromagnetic substance layers 57 of the bottom face 55, is applied to the thickness-wise directions of the first molding material layer 61*a* and the second molding material layer 61*b*. As a result, in the first molding material layer 61*a* and the second molding material layer 61*b*, the conductive particles dispersed in the respective molding material layers are gathered at portions to become the conductive path-forming parts 11 located between each of the ferromagnetic substance layers 52 of the top face 50 and their corresponding ferromagnetic substance layers 57 of the bottom face 55, and oriented so as to align in the thickness-wise directions of the respective molding material layers.

Figure 11:
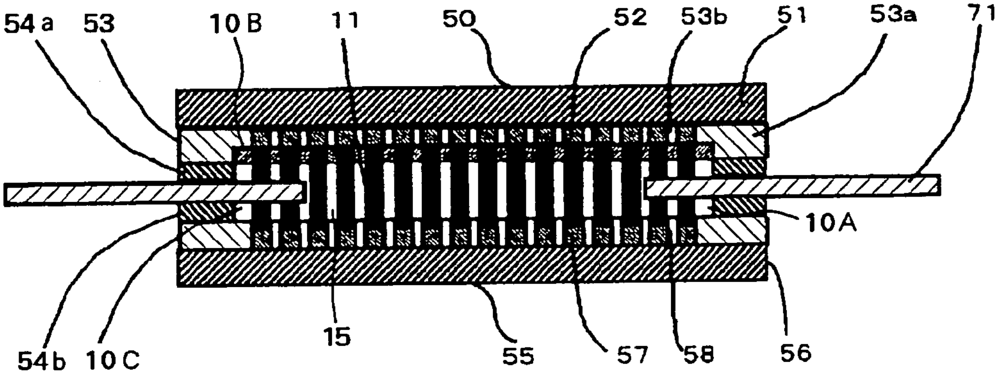
FIG. 11 is a cross-sectional view illustrating a state that an anisotropically conductive film has been formed.

In this state, the respective molding material layers are subjected to a curing treatment, thereby, as illustrated in FIG. 11, forming an anisotropically conductive film 10A in the surface layer portion 10B on one surface side of which the reinforcing material and non-magnetic insulating particles are contained, having conductive path-forming parts 11, in which the conductive particles are charged at high density in the elastic polymeric substance in a state oriented so as to align in the thickness-wise direction, and insulating parts 15 formed so as to surround these conductive path-forming parts 11 and composed of the insulating elastic polymeric substance, in which the conductive particles are not present at all or scarcely present. An anisotropically conductive connector 10 of the construction shown in FIGS. 1 to 3 is thus produced.

In the above-described process, the curing treatment of the respective molding material layers may be conducted in a state that the parallel magnetic field has been applied as it is, but may also be conducted after the application of the parallel magnetic field is stopped.

The intensity of the parallel magnetic field applied to the respective molding material layers is preferably an intensity that it amounts to 20,000 to 1,000,000 μT on the average.

As a means for applying the parallel magnetic field to the respective polymeric material layers, permanent magnets may also be used in place of the electromagnets. As the permanent magnets, those composed of alunico (Fe—Al—Ni—Co alloy), ferrite or the like are preferred in that the intensity of a parallel magnetic field within the above range is achieved.

The curing treatment of the respective molding material layers is suitably selected according to the materials used. However, heating treatment is generally conducted. Specific heating temperature and heating time are suitably selected in view of the kinds of the polymeric substance-forming materials making up the molding material layers, and the like, the time required for movement of the conductive particles, etc.

According to such a production process, the first molding material layer 61*a* containing the reinforcing material and formed on the molding surface of the top face 50 is stacked on the second molding material layer 61*b* formed on the molding surface of the bottom face 55, and the respective molding material layers are subjected to a curing treatment in this state, so that an anisotropically conductive connector 10 having an anisotropically conductive film 10A with the reinforcing material contained in only the surface layer portion 10B on one surface side can be advantageously and surely produced.

Figure 12:
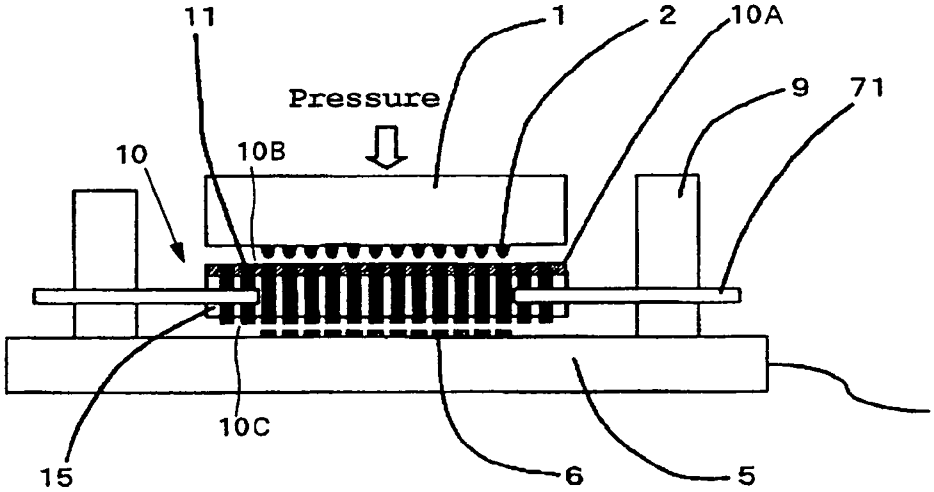
FIG. 12 illustrates the construction of an exemplary inspection apparatus for circuit devices according to the present invention together with a circuit device.

FIG. 12 schematically illustrates the construction of an exemplary inspection apparatus for circuit devices according to the present invention.

This inspection apparatus for circuit devices is equipped with a circuit board 5 for inspection having guide pins 9. On a front surface (upper surface in FIG. 1) of the circuit board 5 for inspection, inspection electrodes 6 are formed in accordance with a pattern corresponding to a pattern of semispherical solder ball electrodes 2 in a circuit device 1 that is an object of inspection.

On the front surface of the circuit board 5 for inspection, is arranged the anisotropically conductive connector 10 of the construction illustrated in FIGS. 1 to 3. Specifically, the guide pins 9 are inserted into the positioning holes 72 (see FIGS. 1 to 3) formed in the supporting body 71 in the anisotropically conductive connector 10, whereby the anisotropically conductive connector 10 is fixed on the front surface of the circuit board 5 for inspection in a state that the conductive path-forming parts 11 in the anisotropically conductive film 10A have been positioned so as to be located on the respective inspection electrodes 6.

In such an inspection apparatus for circuit devices, the circuit device 1 is arranged on the anisotropically conductive connector 10 in such a manner that the solder ball electrodes 2 are located on the respective conductive path-forming parts 11. In this state, for example, the circuit device 1 is pressed in a direction approaching the circuit board 5 for inspection, whereby each of the conductive path-forming parts 11 in the anisotropically conductive connector 10 is in a state held and pressurized by the solder ball electrode 2 and the inspection electrode 6. As a result, electrical connection between each of the solder ball electrodes 2 in the circuit device 1 and its corresponding inspection electrodes 6 of the circuit board 5 for inspection is achieved. In this inspection state, the inspection of the circuit device 1 is conducted.

According to the above-described inspection apparatus for circuit devices, the anisotropically conductive connector 10 is provided, so that occurrence of the permanent deformation and deformation by abrasion of the anisotropically conductive film 10A due to the contact of the electrodes to be inspected with pressure is inhibited even if the electrodes to be inspected are projected solder ball electrodes 2, and so stable conductivity is achieved over a long period of time even when the inspection is conducted continuously as to a great number of circuit devices 1, and moreover the incident that the circuit device 1 adheres to the anisotropically conductive film 10A can be surely prevented or inhibited.

The non-magnetic insulating particles are contained in the surface layer portion 10B on one surface side, with which the circuit device 1 comes into contact, of the anisotropically conductive film 10A in the anisotropically conductive connector 10, whereby the migration of the electrode material of the electrodes 2 to be inspected to the conductive particles is prevented or inhibited, so that more stable conductivity is achieved over a long period of time, and the incident that the circuit device 1 adheres to anisotropically conductive film 10A can be more surely prevented or inhibited even when the apparatus is used in a state the anisotropically conductive connector has been brought into contact under pressure with the circuit device 1 under a high-temperature environment.

Since the use of any other sheet-like connector than the anisotropically conductive connector 10 becomes unnecessary, positioning between the anisotropically conductive connector 10 and the sheet-like connector is unnecessary, so that the problem of positional deviation between the sheet-like connector and the anisotropically conductive connector 10 due to temperature change can be avoided, and moreover the constitution of the inspection apparatus becomes easy.

The present invention is not limited to the above-described embodiments, and various changes or modifications may be added thereto.

(1) When the anisotropically conductive connector 10 according to the present invention is used in electrical inspection of circuit devices, electrodes to be inspected of a circuit device, which is an object of inspection, are not limited to the semispherical solder ball electrodes, and they may be, for example, lead electrodes or flat plate electrodes.

(2) It is not essential to provide the supporting body in the anisotropically conductive connector according to the present invention, and the anisotropically conductive connector may be composed of the anisotropically conductive film alone.

(3) It is not essential to contain the non-magnetic insulating particles in the surface layer portion 10B on one surface side of the anisotropically conductive film 10A.

(4) When the anisotropically conductive connector 10 according to the present invention is used in electrical inspection of circuit devices, the anisotropically conductive film may be caused to integrally adhere to the circuit board for inspection. According to such constitution, positional deviation between the anisotropically conductive film and the circuit board for inspection can be surely prevented.

Such an anisotropically conductive connector can be produced by using, as the mold for producing the anisotropically conductive connector, a mold having a space region for arrangement of a board, in which the circuit board 5 for inspection can be arranged, in the molding cavity of the mold, arranging the circuit board for inspection in the space region for arrangement of a board in the molding cavity of the mold, and charging a molding material into, for example, the molding cavity in this state to conduct a curing treatment.

(5) In the production process of an anisotropically conductive connector according to the present invention, molding material layers, for forming the conductive path-forming parts, in a form corresponding to the mode of the intended anisotropically conductive film are formed by stacking the first molding material layer on the second molding material layer, so that materials of different kinds from each other are used as the first molding material and second molding material, whereby anisotropically conductive connector having desired properties can be obtained.

Specifically, conductive path-forming parts, in which the degree of conductivity is controlled, can be formed by constitution that layer portions different in, for example, the particle diameters of the conductive particles or the contents of the conductive particles from each other are laminated, in addition to the already described constitution that layer portions different in the kinds of the conductive particles from each other are laminated, or conductive path-forming parts, in which elastic properties are controlled, can be formed by constitution that layer portions different in the kinds of the elastic polymeric substances from each other are laminated.

The anisotropically conductive connector according to the present invention can also be produced in accordance with the production processes of the anisotropically conductive connector described in Japanese Patent Application Laid-Open Nos. 2003-77962 and 2003-123869.

(6) In the anisotropically conductive connector according to the present invention, the conductive path-forming parts may be arranged at a fixed pitch, a part of the conductive path-forming parts may serve as effective conductive path-forming parts electrically connected to electrodes to be inspected, and the other conductive path-forming parts may serve as non-effective conductive path-forming parts which are not electrically connected to the electrodes to be inspected.

Figure 13:
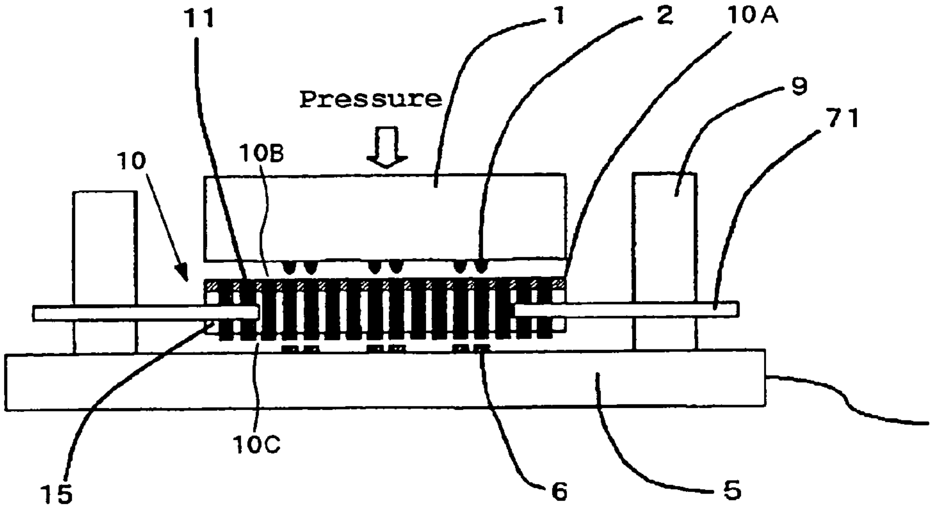
FIG. 13 illustrates the construction of the exemplary inspection apparatus for circuit devices according to the present invention together with another circuit device.

Specifically described, the circuit devices 1, which are objects of inspection, include those of the construction that electrodes to be inspected are arranged only at partial positions among lattice point positions of a fixed pitch, for example, CSP (chip scale package), TSOP (thin small outline package), as illustrated in FIG. 13. In an anisotropically conductive connector 10 for inspecting such a circuit device 1, the conductive path-forming parts 11 may be arranged in accordance with lattice point positions of substantially the same pitch as electrodes to be inspected, conductive path-forming parts 11 located at positions corresponding to the electrodes to be inspected may serve as the effective conductive path-forming parts, and the other conductive path-forming parts 11 may serve as the non-effective conductive path-forming parts.

According to the anisotropically conductive connector 10 of such constitution, the ferromagnetic substance layers of the mold are arranged at a fixed pitch in the production of such an anisotropically conductive connector 10, whereby the conductive particles can be efficiently gathered and oriented at prescribed positions by applying a magnetic field to the molding material layers, and thereby the density of the conductive particles in the resulting respective conductive path-forming parts is made even. As a result, an anisotropically conductive connector small in a difference in resistance value among the respective conductive path-forming parts can be obtained.

(7) Specific form and structure of the anisotropically conductive film may be variously changed.

Figure 14:
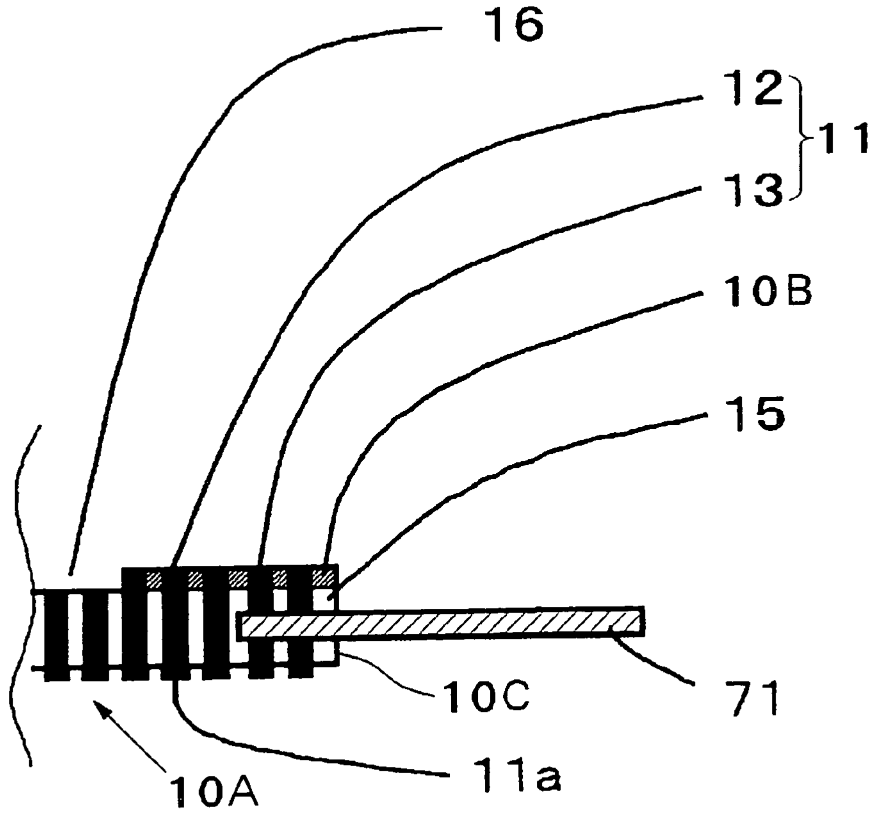
FIG. 14 is a cross-sectional view illustrating a first modified example of the anisotropically conductive film.

As illustrated in, for example, FIG. 14, the anisotropically conductive film 10A may have, at its central portion, a recess 16 in a surface coming into contact with electrodes to be inspected of a circuit device that is an object of inspection.

Figure 15:
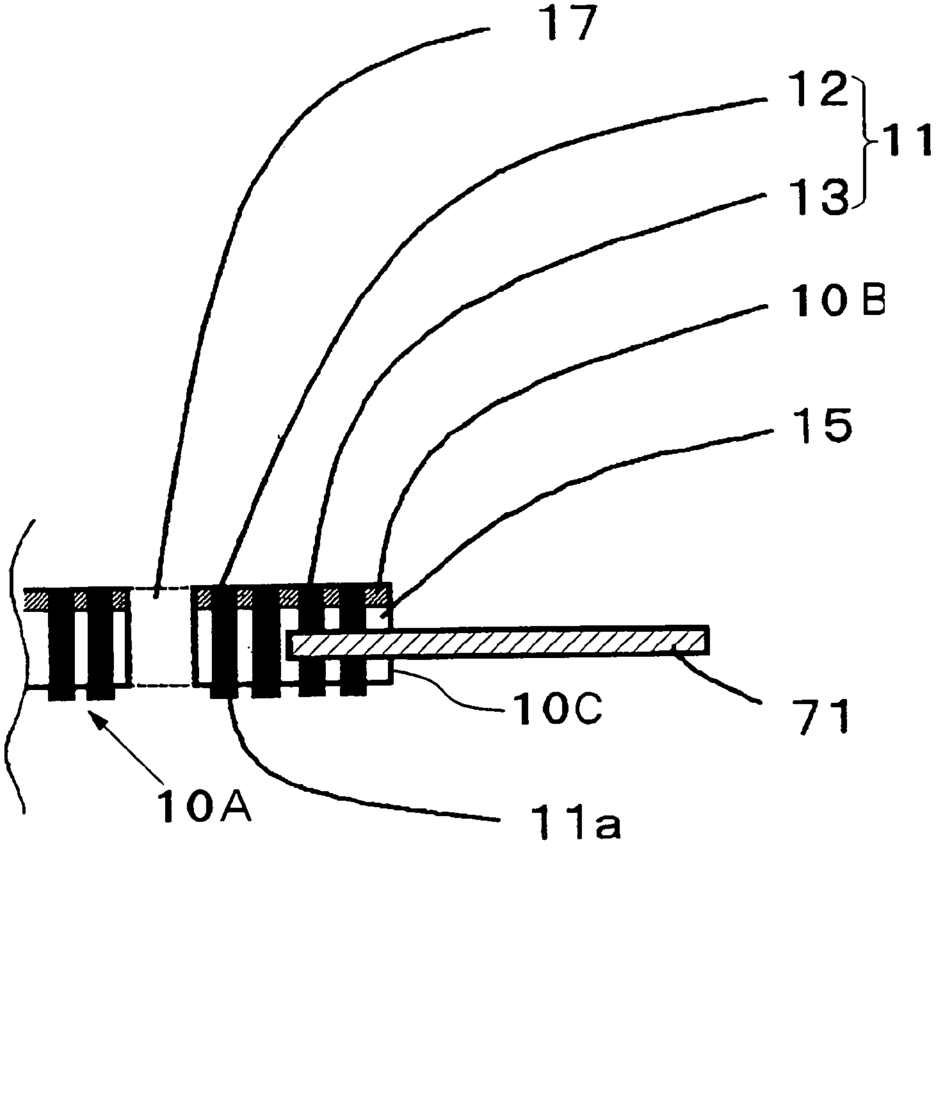
FIG. 15 is a cross-sectional view illustrating a second modified example of the anisotropically conductive film.

As illustrated in FIG. 15, the anisotropically conductive film 10A may have a through-hole 17 at its central portion.

Figure 16:
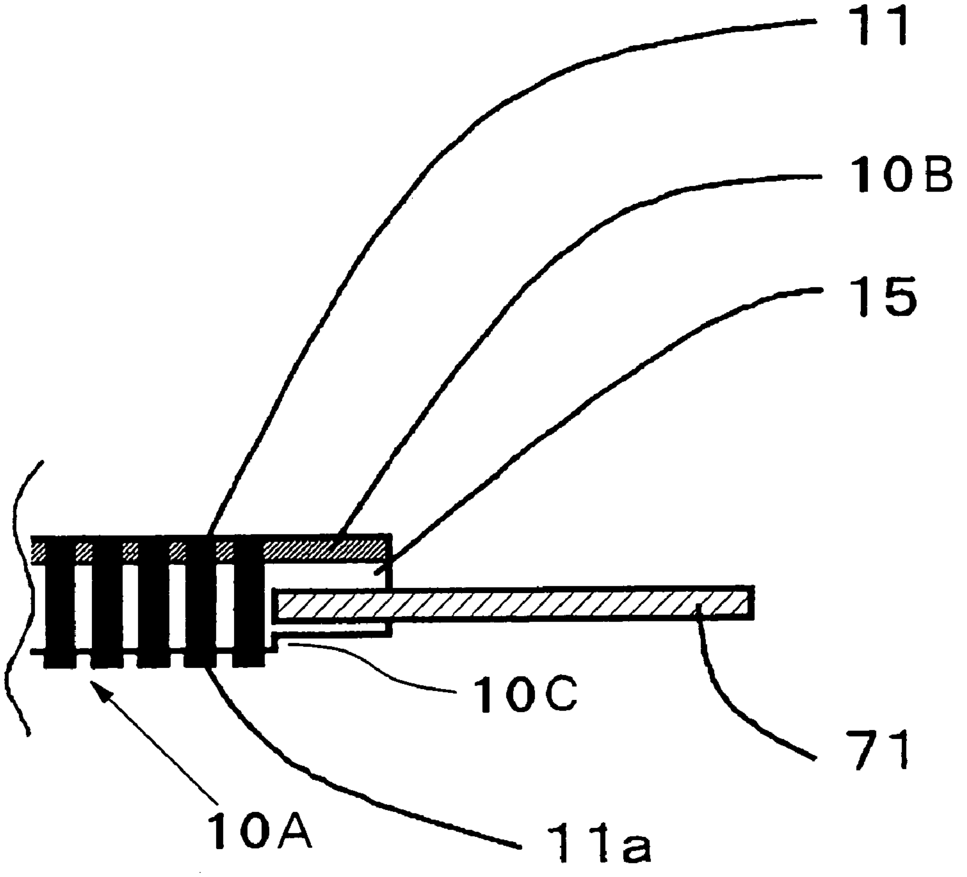
FIG. 16 is a cross-sectional view illustrating a third modified example of the anisotropically conductive film.

As illustrated in FIG. 16, the anisotropically conductive film 10A may be such that no conductive path-forming part 11 is formed at a peripheral edge portion supported by the supporting body 71, and conductive path-forming parts 11 are formed only in another region than the peripheral edge portion. All these conductive path-forming parts 11 may serve as effective conductive path-forming parts.

Figure 17:
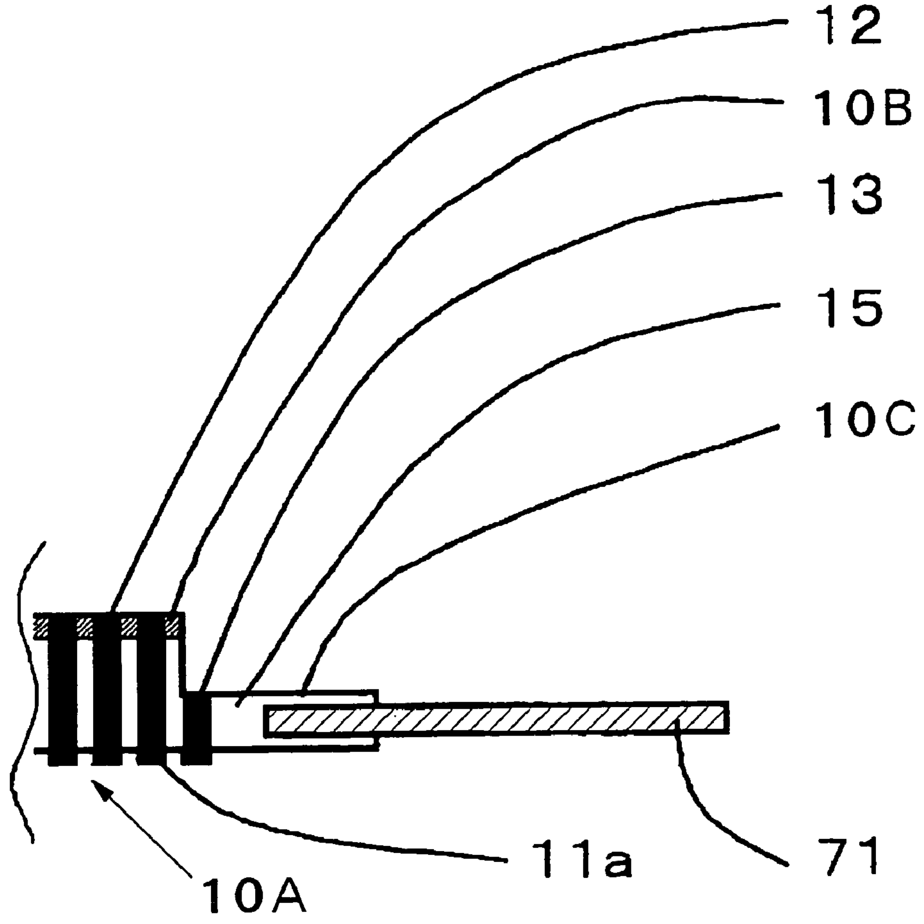
FIG. 17 is a cross-sectional view illustrating a fourth modified example of the anisotropically conductive film.

As illustrated in FIG. 17, the anisotropically conductive film 10A may be such that a non-effective conductive path-forming part 13 is formed between an effective conductive path-forming part 12 and a peripheral edge portion.

Figure 18:
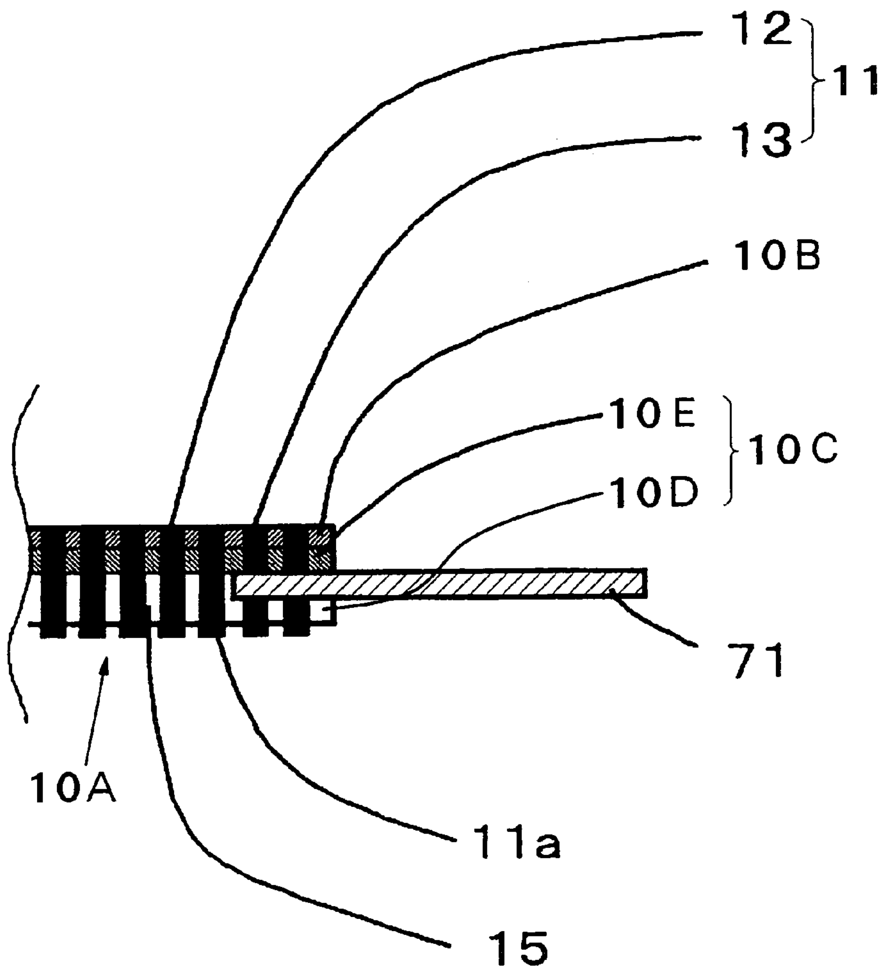
FIG. 18 is a cross-sectional view illustrating a fifth modified example of the anisotropically conductive film.

As illustrated in FIG. 18, another layer portion 10C in the anisotropically conductive film 10A may be composed of a surface layer portion (hereinafter referred to as "surface layer portion on the other surface side") 10D on the other side and an intermediate layer portion 10E formed by an elastic polymeric substance of a kind different from the surface layer portion 10D on the other side, or may have a plurality of intermediate layer portions formed by elastic polymeric substances of kinds different from each other.

Figure 19:
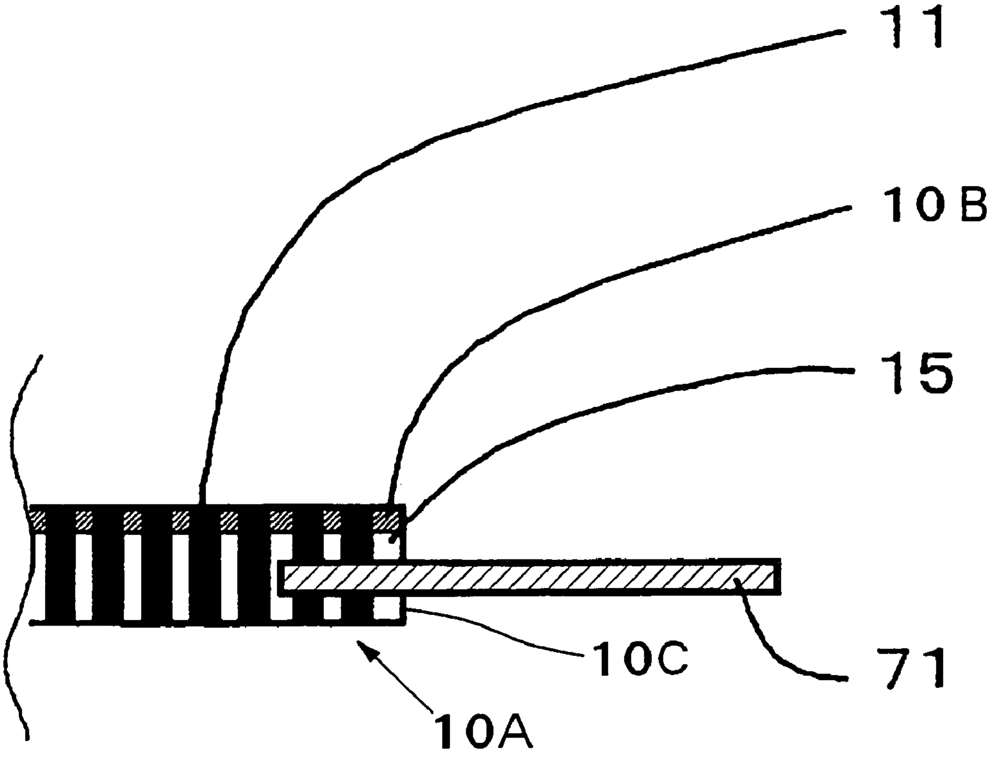
FIG. 19 is a cross-sectional view illustrating a sixth modified example of the anisotropically conductive film.

As illustrated in FIG. 19, the anisotropically conductive film 10A may be such that both surfaces thereof are made flat.

Figure 20:
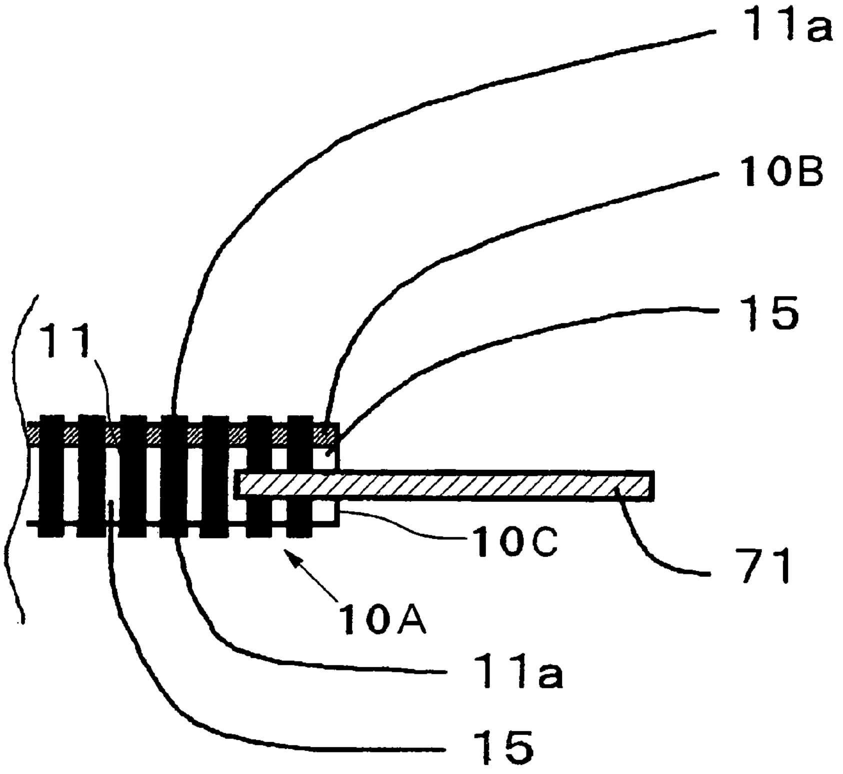
FIG. 20 is a cross-sectional view illustrating a seventh modified example of the anisotropically conductive film.

As illustrated in FIG. 20, the anisotropically conductive film 10A may be such that projected portions 11*a* that the surface of the conductive path-forming part 11 projects from the surface of the insulating part 15 are formed on both surfaces thereof.

Figure 21:
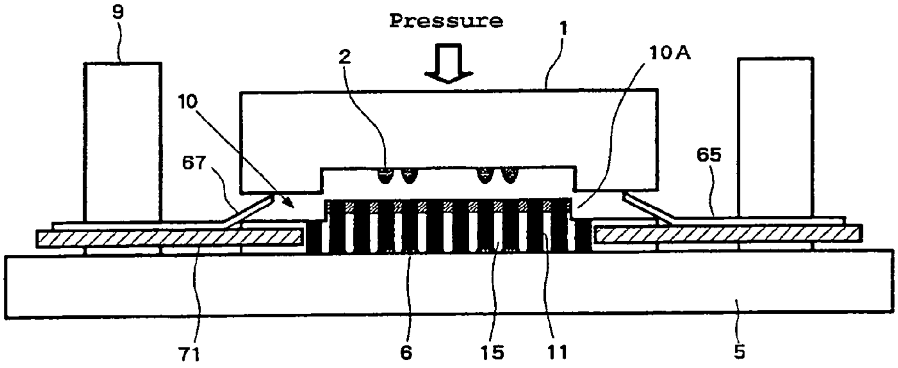
FIG. 21 illustrates the construction of a first exemplary inspection apparatus equipped with a pressurizing force-relaxing frame.

(8) In the inspection apparatus for circuit devices according to the present invention, as illustrated in FIG. 21, the pressurizing force-relaxing frame 65 for relaxing the pressurizing force of electrodes (solder ball electrodes 2) to be inspected against the anisotropically conductive film 10A of the anisotropically conductive connector 10 may be arranged between a circuit device 1, which is an object of inspection, and the anisotropically conductive connector 10.

Figure 22:
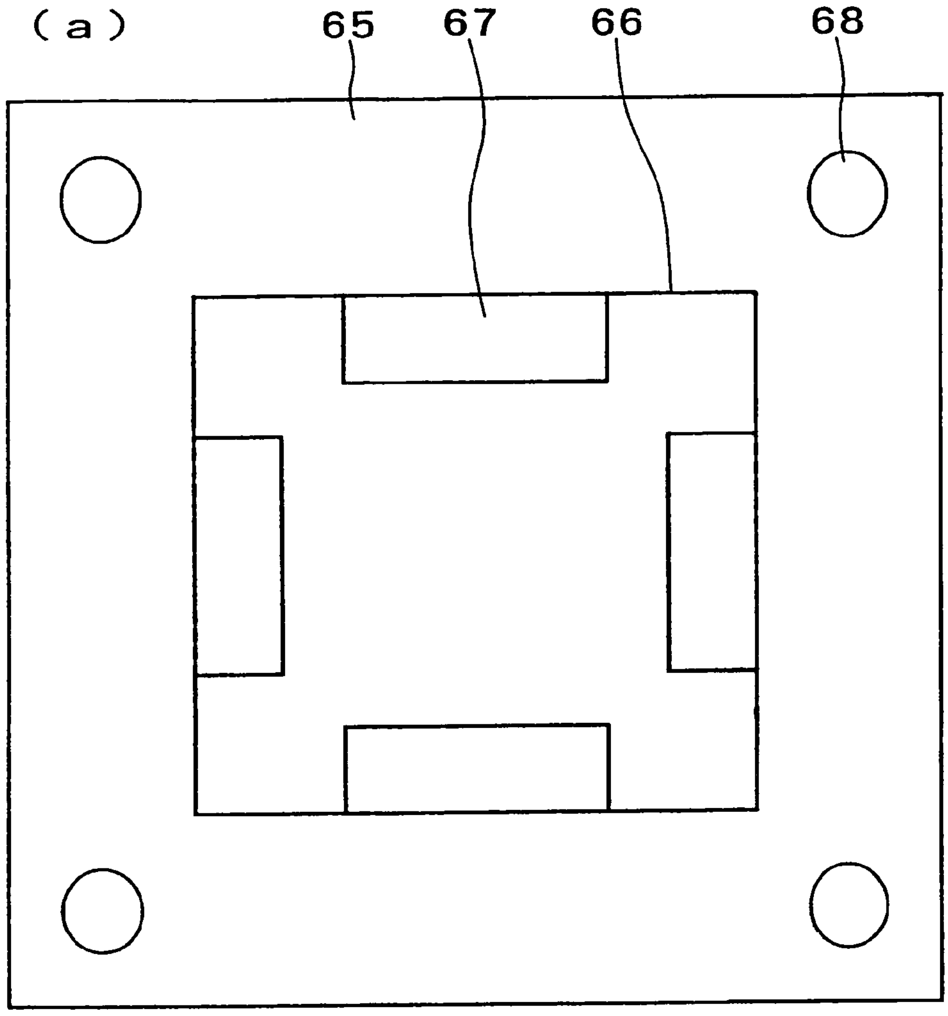
FIG. 22 illustrates a pressurizing force-relaxing frame, in which (a) is a plan view, and (b) is a side elevation.
Figure 22:
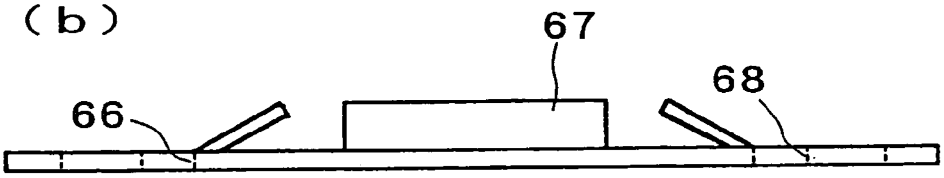

As also illustrated in FIG. 22, the pressurizing force-relaxing frame 65 is in the form of a rectangular plate as a whole, and a substantially rectangular opening 66 for bringing the electrodes to be inspected of the circuit device 1, which is an object of inspection, into contact with the conductive path-forming parts 11 of the anisotropically conductive connector 10 is formed at its central portion. Leaf spring parts 67 are respectively formed integrally with 4 peripheral sides of the opening 66 so as to project inwardly and slantly upward from the respective peripheral sides of the opening 66. In the embodiment illustrated, the pressurizing force-relaxing frame 65 is formed in such a manner that the opening 66 is greater in size than the anisotropically conductive film 10A in the anisotropically conductive connector 10, and arranged in such a manner that only the free end portion of each leaf spring part 67 is located above the peripheral edge portion of the anisotropically conductive film 10A. The height of the free end of the leaf spring part 67 is preset in such a manner that the electrodes to be inspected of the circuit device 1 come into no contact with the anisotropically conductive film 10A when the free end of the leaf spring part 67 comes into contact with the circuit device 1. Positioning holes 68, into which the guide pins of the circuit board 5 for inspection are inserted, are respectively formed at 4 corner positions of the pressurizing force-relaxing frame 65.

Figure 23:
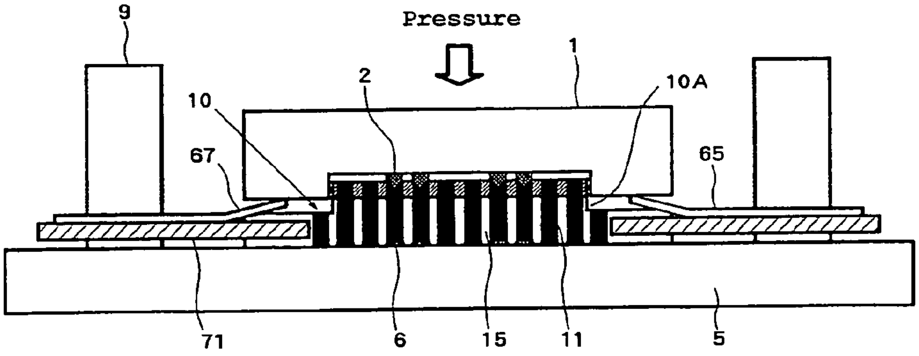
FIG. 23 illustrates a state that a circuit device has been pressurized in the inspection apparatus shown in FIG. 21.

According to the inspection apparatus for circuit devices of such construction, the pressurizing force of the electrodes to be inspected against the anisotropically conductive film 10A of the anisotropically conductive connector 10 is relaxed by the spring elasticity of the leaf spring parts 67 when the circuit device 1 is brought into contact under pressure with the leaf spring parts 67 of the pressurizing force-relaxing frame 65 by pressing, for example, the circuit device 1 in a direction approaching the circuit board 5 for inspection. In addition, in a state that the leaf spring parts 67 of the pressurizing force-relaxing frame 65 have been brought into contact under pressure with the peripheral edge portion of the anisotropically conductive film 10A in the anisotropically conductive connector 10 as illustrated in FIG. 23, the pressurizing force of the electrodes to be inspected against the anisotropically conductive film 10A is more relaxed by the rubber elasticity of the anisotropically conductive film 10A. Accordingly, stable conductivity is achieved in the conductive path-forming parts 11 of the anisotropically conductive film 10A over a longer period of time.

In addition, since the intensity of shock applied to the anisotropically conductive film 10A by the electrodes (solder ball electrodes 2) to be inspected can be reduced by virtue of the spring elasticity by the leaf spring parts 67 of the pressurizing force-relaxing frame 65, so that breaking or any other trouble of the anisotropically conductive film 10A can be prevented or inhibited, and the circuit device 1 can be easily separated from the anisotropically conductive film 10A by the spring elasticity of the leaf spring parts 67 of the pressurizing force-relaxing frame 65 when the pressurizing force against the anisotropically conductive film 10A is released, and so the work of exchanging the circuit device 1 after completion of the inspection to an uninspected circuit device can be smoothly conducted. As a result, inspection efficiency of circuit devices can be improved.

(9) The pressurizing force-relaxing frame 65 is not limited to that shown in FIG. 21.

Figure 24:
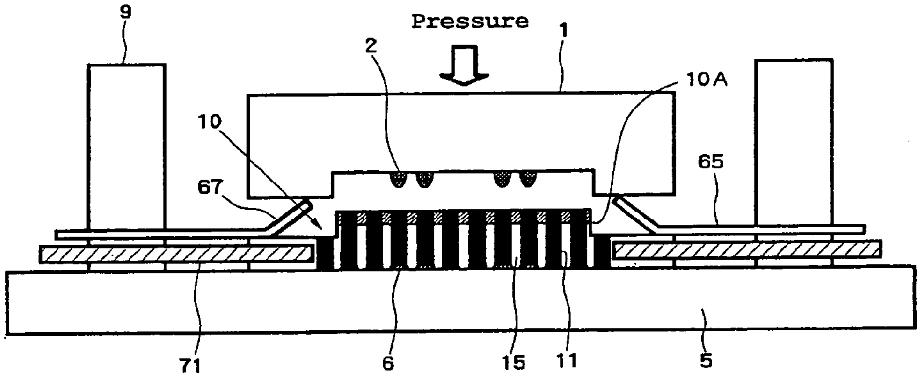
FIG. 24 illustrates the construction of a second exemplary inspection apparatus equipped with a pressurizing force-relaxing frame.

For example, the pressurizing force-relaxing frame 65 may be such that the opening 66 is smaller in size than the anisotropically conductive film 10A in the anisotropically conductive connector 10 as illustrated in FIG. 24.

Figure 25:
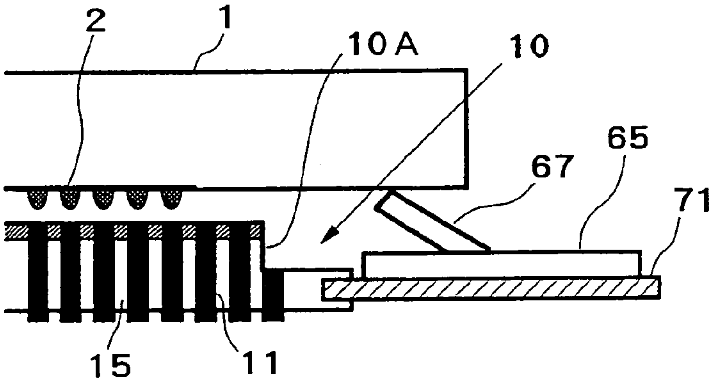
FIG. 25 illustrates the construction of a principal part of a third exemplary inspection apparatus equipped with a pressurizing force-relaxing frame.

The pressurizing force-relaxing frame 65 may also be such that the opening 66 is greater in size than the anisotropically conductive film 10A in the anisotropically conductive connector 10, and the frame is arranged in such a manner that the free end of each leaf spring part 67 is located above an exposed portion of the supporting body 71 as illustrated in FIG. 25. The pressurizing force of the electrodes (solder ball electrodes 2) to be inspected against the anisotropically conductive film 10A of the anisotropically conductive connector 10 is relaxed by only the spring elasticity of the leaf spring parts 67.

Figure 26:
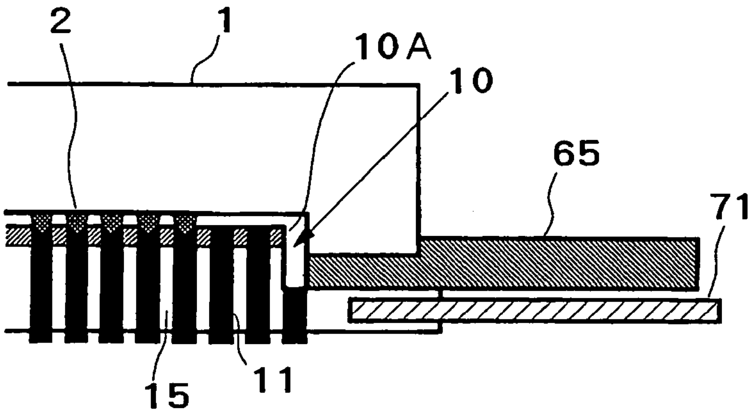
FIG. 26 illustrates the construction of a principal part of a fourth exemplary inspection apparatus equipped with a pressurizing force-relaxing frame.

Further, the pressurizing force-relaxing frame 65 may be that composed of a rubber sheet as illustrated in FIG. 26. According to such construction, the pressurizing force of the electrodes (solder ball electrodes 2) to be inspected against the anisotropically conductive film 10A of the anisotropically conductive connector 10 is relaxed by the rubber elasticity of the pressurizing force-relaxing frame 65.

Figure 27:
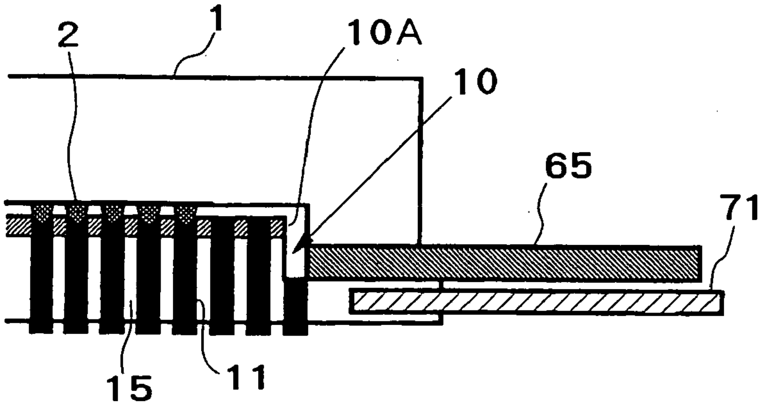
FIG. 27 illustrates the construction of a principal part of a fifth exemplary inspection apparatus equipped with a pressurizing force-relaxing frame.

Further, the pressurizing force-relaxing frame 65 may be that in the form of a plate, which has neither spring elasticity nor rubber elasticity, as illustrated in FIG. 27. According to such construction, the pressurizing force of the electrodes (solder ball electrodes 2) to be inspected against the anisotropically conductive film 10A of the anisotropically conductive connector 10 can be controlled by selecting that having a proper thickness as the pressurizing force-relaxing frame 65.

The present invention will hereinafter be described specifically by the following examples. However, the present invention is not limited to the following examples.

[Addition Type Liquid Silicone Rubber]

In the following examples and comparative examples, that of a two-liquid type that the viscosity of Liquid A is 500 Pa·s, the viscosity of Liquid B is 0.500 Pa·s, and a cured product thereof has a compression set of 6%, a durometer A hardness of 42 and tear strength of 30 kN/m was used as addition type liquid silicone rubber.

The properties of the addition type liquid silicone rubber were determined in the following manner.

(1) Viscosity of Addition Type Liquid Silicone Rubber:

A viscosity at 23±2° C. was measured by a Brookfield viscometer.

(2) Compression Set of Cured Product of Silicone Rubber:

Liquid A and Liquid B in the addition type liquid silicone rubber of the two-liquid type were stirred and mixed in proportions that their amounts become equal. After this mixture was then poured into a mold and subjected to a defoaming treatment by pressure reduction, a curing treatment was conducted under conditions of 120° C. for 30 minutes, thereby producing a columnar body having a thickness of 12.7 mm and a diameter of 29 mm composed of a cured product of the silicone rubber. The columnar body was post-cured under conditions of 200° C. for 4 hours. The columnar body thus obtained was used as a specimen to measure its compression set at 150±2° C. in accordance with JIS K 6249.

(3) Tear Strength of Cured Product of Silicone Rubber:

A curing treatment and post-curing of the addition type liquid silicone rubber were conducted under the same conditions as in the item (2), thereby producing a sheet having a thickness of 2.5 mm. A crescent type specimen was prepared by punching this sheet to measure its tear strength at 23±2° C. in accordance with JIS K 6249.

(4) Durometer A Hardness:

Five sheets produced in the same manner as in the item (3) were stacked on one another, and the resultant laminate was used as a specimen to measure its durometer A hardness at 23±2° C. in accordance with JIS K 6249.

EXAMPLE 1

(a) Production of Supporting Body and Mold:

A supporting body of the following specification was produced in accordance with the construction shown in FIG. 4, and a mold of the following specification for molding an anisotropically conductive film was produced in accordance with the construction shown in FIG. 6.

[Supporting Body]

The supporting body (71) is such that its material is SUS304, the thickness is 0.1 mm, the size of an opening (73) is 17 mm×10 mm, and positioning holes (72) are provided at 4 corners.

[Mold]

Ferromagnetic substance substrates (51, 56) of both top face (50) and bottom face (55) are such that their materials are iron, and the thickness is 6 mm.

Ferromagnetic substance layers (52, 57) of both top face (50) and bottom face (55) are such that their materials are nickel, the diameter is 0.45 mm (circular), the thickness is 0.1 mm, the arrangement pitch (center distance) is 0.8 mm, and the number of the ferromagnetic substance layers in each face is 288 (12×24).

Non-magnetic substance layers (53, 58) of both top face (50) and bottom face (55) are such that their materials are dry film resists subjected to a curing treatment, the thickness of portions (53*a*) in the non-magnetic substance layers (53) of the top face (50) is 0.3 mm, the thickness of portions (53*b*) is 0.1 mm, and the thickness of the non-magnetic substance layers (58) of the bottom face (55) is 0.15 mm.

A molding cavity (59) formed by the mold is 20 mm by 13 mm in dimensions.

(b) Preparation of Molding Material:

Sixty parts by weight of conductive particles having an average particle diameter of 30 μm were added to and mixed with 100 parts by weight of the addition type liquid silicon rubber. Thereafter, the resultant mixture was subjected to a defoaming treatment by pressure reduction, thereby preparing a molding material for forming an anisotropically conductive film. In the above-described process, those (average coating amount: 20% by weight of the weight of core particles) obtained by plating core particles composed of nickel with gold were used as the conductive particles.

(c) Formation of Anisotropically Conductive Film:

A sheet-like reinforcing material composed of mesh (thickness: 0.2 mm, opening diameter: 210 μm, opening rate: 46.0%) formed by polytetrafluoroethylene fiber (fiber diameter: 100 μm) was arranged on a molding surface of the top force (50) of the above-described mold, and the molding material prepared was further applied by screen printing, thereby forming a first molding material layer (61*a*) having a thickness of 0.2 mm with the conductive particles and reinforcing material contained in the liquid addition type silicone rubber.

On the other hand, a spacer (54*b*) having a thickness of 0.1 mm and a rectangular opening of 20 mm by 13 mm in dimensions was arranged in alignment on a molding surface of the bottom face (55) of the mold, the above-described supporting support (71) was arranged in alignment on this spacer (54*b*), a spacer (54*a*) having a thickness of 0.1 mm and a rectangular opening of 20 mm by 13 mm in dimensions was further arranged in alignment on this supporting body (71), and the molding material prepared was applied by screen printing, thereby forming a second molding material layer (61*b*), in which the conductive particles were contained in the liquid addition type silicone rubber, and the thickness of portions located on the non-magnetic substance layers (58) was 0.3 mm, in a cavity defined by the bottom face (55), spacers (54*a*, 54*b*) and supporting body (71).

The first molding material layer (61*a*) formed on the top (50) and the second molding material layer (61*b*) formed on the bottom face (55) were stacked on each other in alignment.

The respective molding material layers formed between the top face (50) and the bottom face (55) were subjected to a curing treatment under conditions of 100° C. for 1 hour while applying a magnetic field of 2 T to portions located between the ferromagnetic substance layers (52, 57) in the thickness-wise direction by electromagnets, thereby forming an anisotropically conductive film (10A).

An anisotropically conductive connector (10) according to the present invention was produced in the above-described manner. The anisotropically conductive film (10A) in the resultant anisotropically conductive connector (10) is in a form of a rectangle having dimensions of 20 mm by 13 mm, wherein the thickness of conductive path-forming parts (11) is 0.55 mm, the thickness of insulating parts (15) is 0.5 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm. Further, a ratio r1/r2 of the opening diameter of the mesh to the average particle diameter of the conductive particles is 7.

This anisotropically conductive connector will hereinafter be referred to as "Anisotropically Conductive Connector A1".

COMPARATIVE EXAMPLE 1

An anisotropically conductive connector was produced in the same manner as in Example 1 except that the reinforcing material was not arranged on the molding surface of the top face (50). The anisotropically conductive film (10A) in the resultant anisotropically conductive connector (10) is in a form of a rectangle having dimensions of 20 mm by 13 mm, wherein the thickness of conductive path-forming parts (11) is 0.55 mm, the thickness of insulating parts (15) is 0.5 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm.

This anisotropically conductive connector will hereinafter be referred to as "Anisotropically Conductive Connector B1".

[Evaluation of Anisotropically Conductive Connector]

With respect to Anisotropically Conductive Connector A1 according to Example 1 and Anisotropically Conductive Connector B1 according to Comparative Example 1, their performance was evaluated in the following manner.

Figure 28:
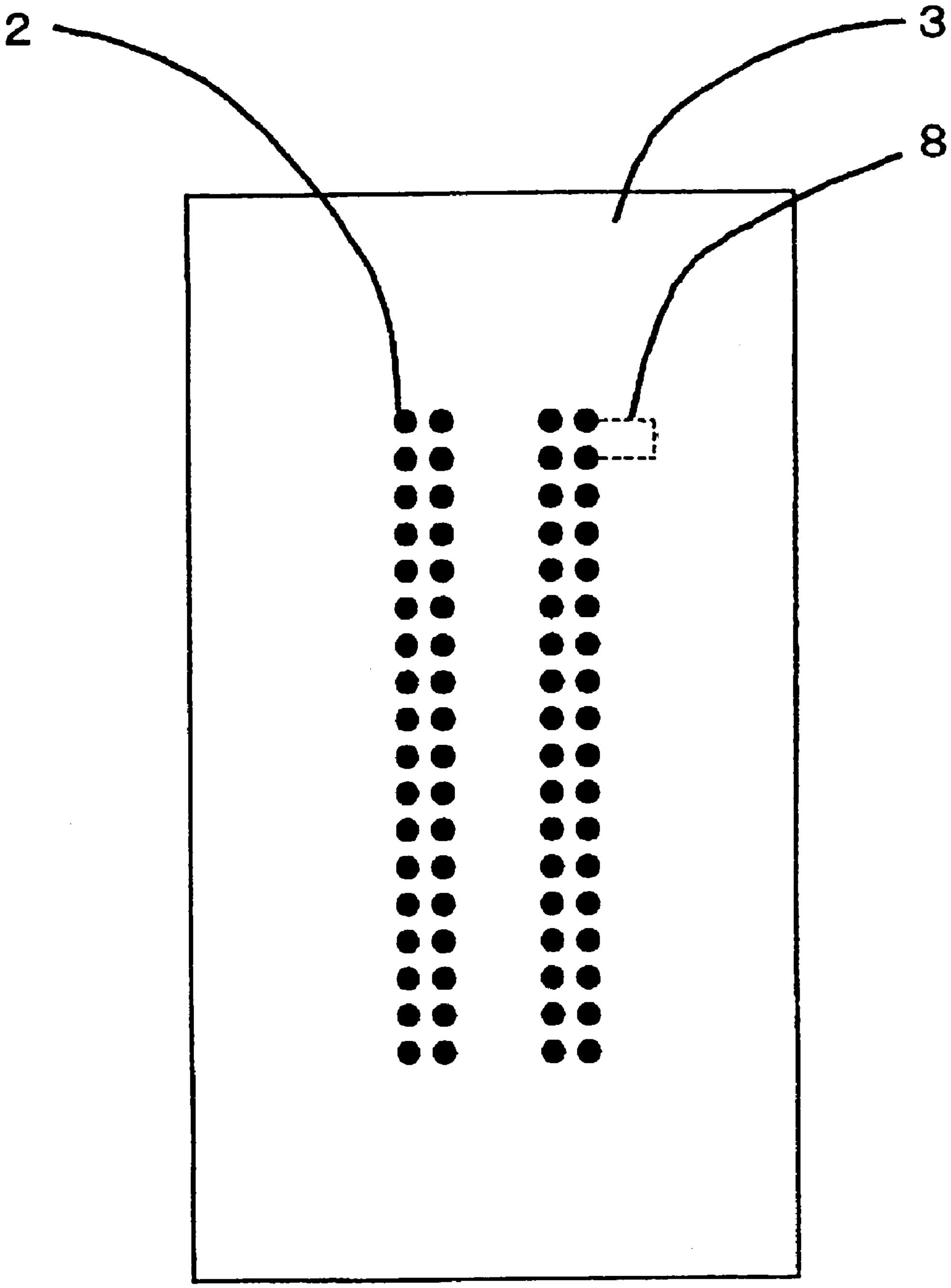
FIG. 28 is a plan view of a circuit device for test used in Examples.
Figure 29:
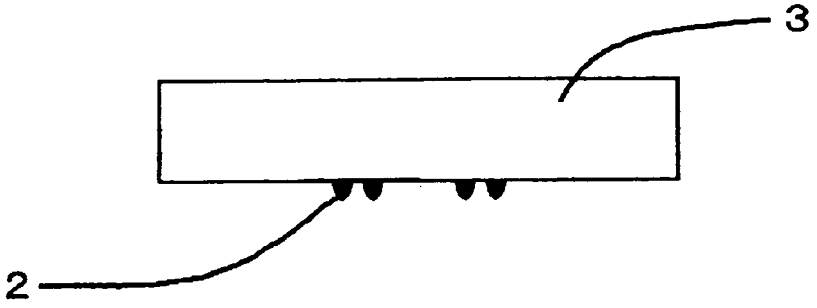
FIG. 29 is a side elevation of the circuit device for test used in Examples.

In order to evaluate Anisotropically Conductive Connector A1 according to Example 1 and Anisotropically Conductive Connector B1 according to Comparative Example 1, such a circuit device 3 for test as illustrated in FIGS. 28 and 29 was provided.

This circuit device 3 for test has 72 solder ball electrodes 2 (material: 64 solder) in total, each having a diameter of 0.4 mm and a height of 0.3 mm. In this circuit device, 2 electrode groups each obtained by arranging 36 solder ball electrodes 2 were formed. In each electrode group, 2 electrode rows in total, which were each composed of 18 solder ball electrodes 2 aligned at a pitch of 0.8 mm, were formed. Every two electrodes of these solder ball electrodes were electrically connected to each other by a wiring 8 within the circuit device 3. The number of wirings within the circuit device 3 was 36 in total.

Such a circuit device for test was used to evaluate Anisotropically Conductive Connector A1 according to Example 1 and Anisotropically Conductive Connector B1 according to Comparative Example 1 in the following manner.

<<Repetitive Durability>>

Figure 30:
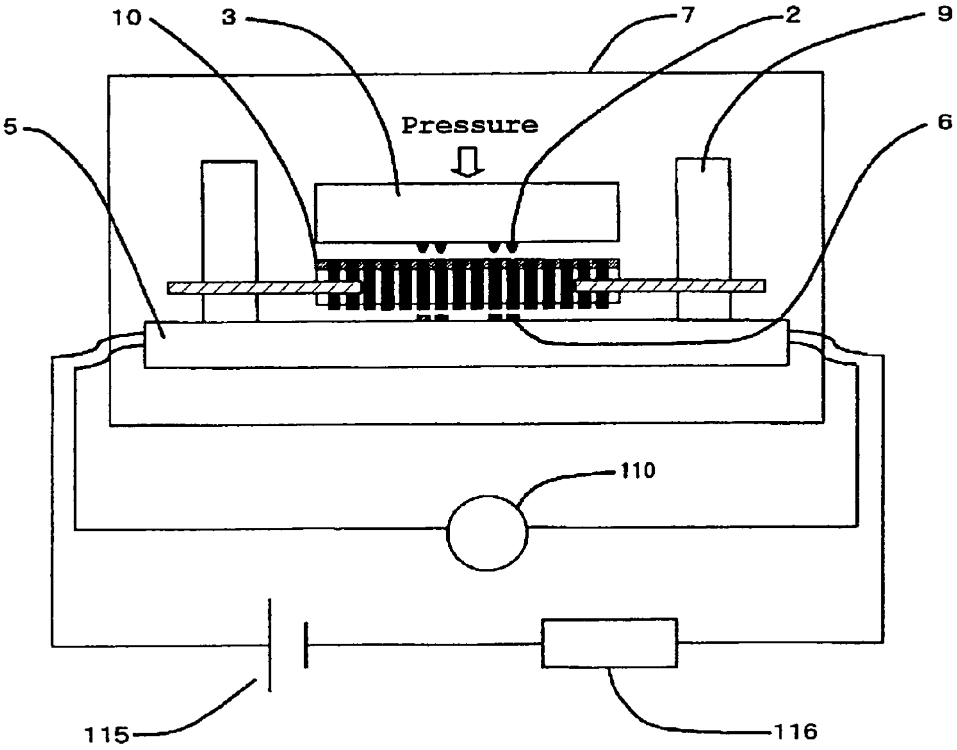
FIG. 30 schematically illustrates the construction of a testing apparatus for repetitive durability used in Examples.

As illustrated in FIG. 30, the anisotropically conductive connector 10 was arranged in alignment on the circuit board 5 for inspection by inserting the guide pins 9 of the circuit board 5 for inspection into the positioning holes of the supporting body 71 in the anisotropically conductive connector 10, and the circuit device 3 for test was arranged on this anisotropically conductive connector 10. These were fixed by a pressurizing jig (not illustrated) and arranged within a thermostatic chamber 7 in this state.

The temperature within the thermostatic chamber 7 was set to 100° C., and a DC current of 10 mA was applied constantly between external terminals (not illustrated) of the circuit board 5 for inspection, which were electrically connected to each other through the anisotropically conductive connector 10, the circuit device 3 for test, and the inspection electrodes 2 of the circuit board 5 for inspection and wirings (not illustrated) thereof by means of a DC power source 115 and a constant-current controller 116 while repeating pressurization at a pressurizing cycle of 5 sec/stroke by the pressuring jig in such a manner that a distortion factor of the conductive path-forming parts 11 of the anisotropically conductive film 10A in the anisotropically conductive connector 10 is 30% (thickness of the conductive path-forming parts upon pressurization: 0.4 mm), thereby measuring voltage between the external terminals of the circuit board 5 for inspection upon the pressurization by a voltmeter 110.

Supposing that a voltage value (V) measured in such a manner is $V_1$, and the DC current applied is $I_1$(=0.01 A) an electric resistance value $R_1$ (Ω) was found in accordance with an expression, $R_1=V_1/I_1$.

Here, the electric resistance value $R_1$ includes an electric resistance value between the electrodes of the circuit device 3 for test and an electric resistance value between the external terminals of the circuit board for inspection in addition to an electric resistance value between 2 conductive path-forming parts.

Since electrical inspection of the circuit device became difficult in fact when the electric resistance value $R_1$ was higher than 2 Ω, the measurement of voltage was continued until the electric resistance value $R_1$ exceeded 2 Ω. However, the pressuring operation was conducted 100,000 times in total. The results are shown in Table 1.

After completion of these tests, the deformed conditions of the conductive path-forming parts and the migrated conditions of the electrode material to the conductive particles as to the respective anisotropically conductive connectors were evaluated in accordance with the following respective standards. The results are shown in Table 2.

Deformed Condition of Conductive Path-forming Parts:

The surfaces of the conductive path-forming parts were observed visually to rank as ○ where deformation was scarcely caused, as Δ where fine deformation was observed, or X where great deformation was observed.

Migrated Condition of Electrode Material to Conductive Particles:

The color of the conductive particles in the conductive path-forming parts was observed visually to rank as ○ where discoloration was scarcely caused, as Δ where the color was slightly changed to gray, or X where the color was almost changed to gray or black.

<<Adhesive Property to Circuit Board>>

One hundred Anisotropically Conductive Connectors A1 according to Example 1 and Anisotropically Conductive Connectors B1 according to Comparative Example 1 were respectively provided. With respect to these anisotropically conductive connectors, a pressurizing test was conducted in the same manner as in the repetitive durability test described above. Thereafter, the adhered condition of the anisotropically conductive film to the circuit device for test was observed to rank as ○ where the number of adhered films was less than 30%, as Δ where the number was 30 to 70%, or x where the number exceeds 70%. The results are shown in Table 2.

TABLE 1

| | Electric Registance Value $R_1$ (Ω) | | | | | | | | |
|---|---|---|---|---|---|---|---|---|---|
| | Pressurized 1 time | Pressurized 1000 times | Pressurized 3000 times | Pressurized 5000 times | Pressurized 10000 times | Pressurized 30000 times | Pressurized 50000 times | Pressurized 70000 times | Pressurized 100000 times |
| Example 1 | <0.5 | <0.5 | <0.5 | <0.5 | <0.5 | <0.5 | <0.5 | <0.5 | <1.0 |
| Comparative Example 1 | <0.5 | <0.5 | <1.0 | <1.5 | <2 | — | — | — | — |

TABLE 2

| | Deformed condition of conductive path-forming parts | Migrated condition of electrode material to conductive particles | Adhesive property to circuit board |
|---|---|---|---|
| Example 1 | ○ | ○ | ○ |
| Comparative example 1 | X | X | Δ |

As apparent from the results shown in Tables 1 and 2, it was confirmed that according to Anisotropically Conductive Connector A1 of Example 1, occurrence of permanent deformation by contact of the circuit device with pressure and deformation by abrasion is inhibited even when the connector is pressed repeatedly by the circuit device, and so stable conductivity is achieved over a long period of time, and moreover adhesion of the circuit device is surely prevented or inhibited.

EXAMPLE 2

(a) Production of Supporting Body and Mold:

A supporting body of the following specification was produced in accordance with the construction shown in FIG. 4, and a mold of the following specification for molding an anisotropically conductive film was produced in accordance with the construction shown in FIG. 6 except that non-magnetic substance layers of a top face had an even thickness, and no recess was formed in the surface of the top face.

[Supporting Body]

The supporting body (71) is such that its material is SUS304, the thickness is 0.15 mm, the size of an opening (73) is 17 mm×10 mm, and positioning holes (72) are provided at 4 corners.

[Mold]

Ferromagnetic substance substrates (51, 56) of both top face (50) and bottom face (55) are such that their materials are iron, and the thickness is 6 mm.

Ferromagnetic substance layers (52, 57) of both top face (50) and bottom face (55) are such that their materials are nickel, the diameter is 0.45 mm (circular), the thickness is 0.1 mm, the arrangement pitch (center distance) is 0.8 mm, and the number of the ferromagnetic substance layers in each face is 288 (12×24).

Non-magnetic substance layers (53, 58) of both top face (50) and bottom face (55) are such that their materials are dry film resists subjected to a curing treatment, the thickness of the non-magnetic substance layers (53) of the top face (50) is 0.1 mm, and the thickness of the non-magnetic substance layers (58) of the bottom face (55) is 0.15 mm.

A molding cavity (59) formed by the mold is 20 mm by 13 mm in dimensions.

(b) Preparation of Molding Material:

Sixty parts by weight of conductive particles having an average particle diameter of 30 μm were added to and mixed with 100 parts by weight of the addition type liquid silicone rubber. Thereafter, the resultant mixture was subjected to a defoaming treatment by pressure reduction, thereby preparing a molding material for forming an anisotropically conductive film. In the above-described process, those (average coating amount: 20% by weight of the weight of core particles) obtained by plating core particles composed of nickel with gold were used as the conductive particles.

(c) Formation of Anisotropically Conductive Film:

A spacer (54*a*) having a thickness of 0.2 mm, in which a rectangular opening of 20 mm by 13 mm in dimensions had been formed, was arranged in alignment on a molding surface of the top face (50) of the above-described mold, a sheet-like reinforcing material composed of mesh (thickness: 0.115 mm, opening diameter: 184 μm, opening rate: 52%) formed by polyarylate type composite fiber (fiber diameter: 70 μm) was arranged within the opening of the spacer (54*a*), and the molding material prepared was further applied by screen printing, thereby forming a first molding material layer (61*a*) having a thickness of 0.2 mm with the conductive particles and reinforcing material contained in the liquid addition type silicone rubber.

On the other hand, a spacer (54*b*) having a thickness of 0.15 mm, in which a rectangular opening of 20 mm by 13 mm in dimensions had been formed, was arranged in alignment on a molding surface of the bottom face (55) of the mold, the above-described supporting body (71) was arranged in alignment on this spacer (54*b*), and the molding material prepared was applied by screen printing, thereby forming a second molding material layer (61*b*), in which the conductive particles were contained in the liquid addition type silicone rubber, and the thickness of portions located on the non-magnetic substance layers (58) was 0.3 mm, in a cavity defined by the bottom face (55), spacer (54*b*) and supporting body (71).

The first molding material layer (61*a*) formed on the top face (50) and the second molding material layer (61*b*) formed on the bottom face (55) were stacked on each other in alignment.

The respective molding material layers formed between the top face (50) and the bottom face (55) were subjected to a curing treatment under conditions of 100° C. for 1 hour while applying a magnetic field of 2 T to portions located between the ferromagnetic substance layers (52, 57) in the thickness-wise direction by electromagnets, thereby forming an anisotropically conductive film (10A).

An anisotropically conductive connector (10) according to the present invention was produced in the above-described manner. The anisotropically conductive film (10A) in the resultant anisotropically conductive connector (10) is in a form of a rectangle having dimensions of 20 mm by 13 mm, wherein the thickness of conductive path-forming parts (11) is 0.55 mm, the thickness of insulating parts (15) is 0.5 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm. Further, a ratio r1/r2 of the opening diameter of the mesh to the average particle diameter of the conductive particles is 6.13.

This anisotropically conductive connector will hereinafter be referred to as "Anisotropically Conductive Connector C1".

EXAMPLE 3

An anisotropically conductive connector (10) according to the present invention was produced in the same manner as in Example 2 except that the spacer (54*a*) arranged on the molding surface of the top face (50) was changed to that having a thickness of 0.1 mm, and the spacer (54*b*) arranged on the molding surface of the bottom face (55) was changed to that having a thickness of 0.1 mm. The anisotropically conductive film (10A) in the resultant anisotropically conductive connector (10) is in a form of a rectangle having dimensions of 20 mm by 13 mm, wherein the thickness of conductive path-forming parts (11) is 0.40 mm, the thickness of insulating parts (15) is 0.35 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm. Further, a ratio r1/r2 of the opening diameter of the mesh to the average particle diameter of the conductive particles is 6.13.

This anisotropically conductive connector will hereinafter be referred to as "Anisotropically Conductive Connector C2".

EXAMPLE 4

An anisotropically conductive connector (10) according to the present invention was produced in the same manner as in Example 2 except that the reinforcing material was changed to a sheet-like reinforcing material composed of mesh (thickness: 0.19 mm, opening diameter: 408 μm, opening rate: 65%) formed by polyarylate type composite fiber (fiber diameter: 100 μm). The anisotropically conductive film (10A) in the resultant anisotropically conductive connector (10) is in a form of a rectangle having dimensions of 20 mm by 13 mm, wherein the thickness of conductive path-forming parts (11) is 0.55 mm, the thickness of insulating parts (12) is 0.40 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm. Further, a ratio r1/r2 of the opening diameter of the mesh to the average particle diameter of the conductive particles is 13.6.

This anisotropically conductive connector will hereinafter be referred to as "Anisotropically Conductive Connector C3".

COMPARATIVE EXAMPLE 2

An anisotropically conductive connector was produced in the same manner as in Example 2 except that the reinforcing material was not arranged on the molding surface of the top face (50). The anisotropically conductive film in the resultant anisotropically conductive connector is in a form of a rectangle having dimensions of 20 mm by 13 mm, wherein the thickness of conductive path-forming parts is 0.55 mm, the thickness of insulating parts is 0.50 mm, the number of conductive path-forming parts is 288 (12×24), the diameter of each conductive path-forming part is 0.45 mm, and the arrangement pitch (center distance) of the conductive path-forming parts is 0.8 mm.

This anisotropically conductive connector will hereinafter be referred to as "Anisotropically Conductive Connector D1".

COMPARATIVE EXAMPLE 3

An anisotropically conductive connector was produced in the same manner as in Example 3 except that the reinforcing material was not arranged on the molding surface of the top face (50). The anisotropically conductive film in the resultant anisotropically conductive connector is in a form of a rectangle having dimensions of 20 mm by 13 mm, wherein the thickness of conductive path-forming parts is 0.40 mm, the thickness of insulating parts is 0.35 mm, the number of conductive path-forming parts is 288 (12×24), the diameter of each conductive path-forming part is 0.45 mm, and the arrangement pitch (center distance) of the conductive path-forming parts is 0.8 mm.

This anisotropically conductive connector will hereinafter be referred to as "Anisotropically Conductive Connector D2".

[Evaluation of Anisotropically Conductive Connector]

With respect to Anisotropically Conductive Connectors C1 to C3 according to Examples 2 to 4 and Anisotropically Conductive Connectors D1 and D2 according to Comparative Examples 2 and 3, their performance was evaluated in the following manner.

In order to evaluate Anisotropically Conductive Connectors C1 to C3 according to Examples 2 to 4 and Anisotropically Conductive Connectors D1 and D2 according to Comparative Examples 2 and 3, such a circuit device 3 for test as illustrated in FIGS. 28 and 29 was provided.

This circuit device 3 for test has 72 solder ball electrodes 2 (material: 64 solder) in total, each having a diameter of 0.4 mm and a height of 0.3 mm. In this circuit device, 2 electrode groups each obtained by arranging 36 solder ball electrodes 2 were formed. In each electrode group, 2 electrode rows in total, which were each composed of 18 solder ball electrodes 2 aligned at a pitch of 0.8 mm, were formed. Every two electrodes of these solder ball electrodes were electrically connected to each other by a wiring 8 within the circuit device 3. The number of wirings within the circuit device 3 was 36 in total.

Such a circuit device for test was used to evaluate Anisotropically Conductive Connectors C1 to C3 according to Examples 2 to 4 and Anisotropically Conductive Connectors D1 and D2 according to Comparative Examples 2 and 3 in the following manner.

<<Initial Properties>>

As illustrated in FIG. 30, the anisotropically conductive connector 10 was arranged in alignment on the circuit board 5 for inspection by inserting the guide pins 9 of the circuit board 5 for inspection into the positioning holes of the supporting body 71 in the anisotropically conductive connector 10, and the circuit device 3 for test was arranged on this anisotropically conductive connector 10. These were pressurized and fixed at room temperature under a load of 4.5 kg (load applied to every conductive path-forming part: about 60 g) by a pressurizing jig (not illustrated). A DC current of 10 mA was constantly applied between external terminals (not illustrated) of the circuit board 5 for inspection, which were electrically connected to each other through the anisotropically conductive connector 10, the circuit device 3 for test, and the inspection electrodes 2 of the circuit board 5 for inspection and wirings (not illustrated) thereof by means of a DC power source 115 and a constant-current controller 116, thereby measuring voltage between the external terminals of the circuit board 5 for inspection upon the pressurization by a voltmeter 110.

Supposing that a voltage value (V) measured in such a manner is $V_1$, and the DC current applied is $I_1$(=0.01 A), an electric resistance value $R_1$ (Ω) was found in accordance with an expression, $R_1=V_1/I_1$. The results are shown in Table 3.

TABLE 3

| | Electric registance value $R_1$ (Ω) | | |
|---|---|---|---|
| | Minimum Value | Maximum Value | Average value |
| Example 2 | 0.06 | 0.12 | 0.10 |
| Example 3 | 0.10 | 0.15 | 0.13 |
| Example 4 | 0.06 | 0.11 | 0.08 |
| Comparative Example 2 | 0.05 | 0.10 | 0.07 |
| Comparative Example 3 | 0.09 | 0.15 | 0.12 |

As apparent from the results shown in Table 3, it was confirmed that Anisotropically Conductive Connectors C1 to C3 according to Examples 2 to 4 have good conductivity equivalent to Anisotropically Conductive Connectors D1 and D2 according to Comparative Examples 2 and 3, in which no reinforcing material was contained in the anisotropically conductive film.

<<Repetitive Durability>>

As illustrated in FIG. 30, the anisotropically conductive connector 10 was arranged in alignment on the circuit board 5 for inspection by inserting the guide pins 9 of the circuit board 5 for inspection into the positioning holes of the supporting body 71 in the anisotropically conductive connector 10, and the circuit device 3 for test was arranged on this anisotropically conductive connector 10. These were fixed by a pressurizing jig (not illustrated) and arranged within a thermostatic chamber 7 in this state.

The temperature within the thermostatic chamber 7 was set to 125° C., and a DC current of 10 mA was applied constantly between external terminals (not illustrated) of the circuit board 5 for inspection, which were electrically connected to each other through the anisotropically conductive connector 10, the circuit device 3 for test, and the inspection electrodes 2 of the circuit board 5 for inspection and wirings (not illustrated) thereof by means of a DC power source 115 and a constant-current controller 116 while repeating pressurization at a pressurizing cycle of 5 sec/stroke by the pressuring jig under conditions that a load of 4.5 kg (load applied to every conductive path-forming part: about 60 g) for the anisotropically conductive connectors according to Example 2, Example 4 and Comparative Example 2, and a load of 3.0 kg (load applied to every conductive path-forming part: about 40 g) for the anisotropically conductive connectors according to Example 3 and Comparative Example 3, thereby measuring voltage between the external terminals of the circuit board 5 for inspection upon the pressurization by a voltmeter 110.

Supposing that a voltage value (V) measured in such a manner is $V_1$, and the DC current applied is $I_1$(=0.01 A), an electric resistance value $R_1$ (Ω) was found in accordance with an expression, $R_1=V_1/I_1$.

Here, the electric resistance value $R_1$ includes an electric resistance value between the electrodes of the circuit device 3 for test and an electric resistance value between the external terminals of the circuit board for inspection in addition to an electric resistance value between 2 conductive path-forming parts.

The number of times of the pressurization until the electric resistance value $R_1$ exceeded 1 Ω was determined. The results are shown in Table 4.

TABLE 4

| | Thickness of conductive path-forming parts (mm) | Pressurizing load (kg) | Initial value of electric registance value $R_1$ (Ω) | | | Number of times of the pressurization until the electric resistance value $R_1$ exceeded 1Ω (count) |
|---|---|---|---|---|---|---|
| | | | Minimum value | Maximum value | Average value | |
| Example 2 | 0.55 | 4.5 | 0.08 | 0.15 | 0.12 | 105000 |
| Example 3 | 0.4 | 3 | 0.12 | 0.18 | 0.15 | 109000 |
| Example 4 | 0.55 | 4.5 | 0.08 | 0.13 | 0.11 | 36000 |
| Comparative Example 2 | 0.55 | 4.5 | 0.07 | 0.13 | 0.10 | 27000 |
| Comparative Example 3 | 0.4 | 3 | 0.10 | 0.18 | 0.15 | 28000 |

After completion of the durability test, the surfaces of the conductive path-forming parts of the respective anisotropically conductive connectors were observed visually.

As a result, it was confirmed that the conductive path-forming parts of Anisotropically Conductive Connectors C1 to C3 according to Examples 2 to 4 are scarcely deformed, and the conductive particles are retained in the conductive path-forming parts.

With respect to Anisotropically Conductive Connector C3 according to Example 4, hollows were formed in the surface layer portions of a part of the conductive path-forming parts, and the conductive particles were present in the surface layer portions of the insulating parts around the hollows formed.

With respect to Anisotropically Conductive Connectors D1 and D2 according to Comparative Examples 2 and 3, hollows were formed in the surface layer portions of the conductive path-forming parts, and the conductive particles were present in the surface layer portions of the insulating parts around the hollows formed. This is considered to be attributable to the fact that the surface layer portions of conductive part-forming parts were abraded by repeated pressurization by the protruding electrodes, and consequently the conductive particles contained in the surface layer portions were scattered over, and the conductive particles were pushed into the surface layer portions of the insulating parts by further pressurized by the circuit device for test.

As apparent from the above-described results, it was confirmed that according to Anisotropically Conductive Connectors C1 to C3 of Examples 2 to 4, occurrence of permanent deformation by contact of the protruding electrodes with pressure and deformation by abrasion is inhibited even when the conductive path-forming parts are pressed repeatedly by the protruding electrodes, and so stable conductivity is achieved over a long period of time.

REFERENTIAL EXAMPLE 1

An anisotropically conductive connector (10) according to the present invention was produced in the same manner as in Example 2 except that the reinforcing material was changed to a sheet-like reinforcing material composed of mesh (thickness: 0.052 opening diameter: 72 μm, opening rate: 50%) formed by polyarylate type composite fiber (fiber diameter: 30 μm). The anisotropically conductive film (10A) in the resultant anisotropically conductive connector (10) is in a form of a rectangle having dimensions of 20 mm by 13 mm, wherein the thickness of conductive path-forming parts (11) is 0.55 mm, the thickness of insulating parts (15) is 0.40 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm. Further, a ratio r1/r2 of the opening diameter of the mesh to the average particle diameter of the conductive particles is 2.4.

The initial properties of this anisotropically conductive connector were determined in the same manner as in Example 2. As a result, the minimum value, maximum value and average value of an electric resistance value $R_1$ were 0.20 Ω, 2.56 Ω and 0.75 Ω, respectively.

REFERENTIAL EXAMPLE 2

An anisotropically conductive connector (10) according to the present invention was produced in the same manner as in Example 2 except that the reinforcing material was changed to a sheet-like reinforcing material composed of mesh (thickness: 0.073 mm, opening diameter: 114 μm, opening rate: 51%) formed by polyarylate type composite fiber (fiber diameter: 45 μm). The anisotropically conductive film (10A) in the resultant anisotropically conductive connector (10) is in a form of a rectangle having dimensions of 20 mm by 13 mm wherein the thickness of conductive path-forming parts (11) is 0.55 mm, the thickness of insulating parts (15) is 0.40 mm, the number of conductive path-forming parts (11) is 288 (12×24), the diameter of each conductive path-forming part (11) is 0.45 mm, and the arrangement pitch (center distance) of the conductive path-forming parts (11) is 0.8 mm. Further, a ratio r1/r2 of the opening diameter of the mesh to the average particle diameter of the conductive particles is 3.8.

The initial properties of this anisotropically conductive connector were determined in the same manner as in Example 2. As a result, the minimum value, maximum value and average value of an electric resistance value $R_1$ were 0.15 Ω, 3.15 Ω and 0.88 Ω, respectively.

The invention claimed is:

1. An anisotropically conductive connector, comprising:

an anisotropically conductive film formed of an insulating elastic polymeric substance and including, a plurality of conductive path-forming parts including conductive first particles exhibiting magnetism and having a diameter r2 of 1 to 100 μm, the plurality of conductive path forming parts extending in a thickness-wise direction of the film, insulating parts that mutually insulate the plurality of conductive path forming parts, a surface layer portion formed on one surface side of the anisotropically conductive film and including a reinforcing material of insulating mesh formed of an organic fiber wherein a diameter r1 of the mesh openings is ≦500 μm and a ratio of r1/r2 is at least 1.5.

2. The anisotropically conductive connector according to claim 1, wherein a supporting body for supporting a peripheral edge portion of the anisotropically conductive film is provided.

3. The anisotropically conductive connector according to claim 1, which is an anisotropically conductive connector for conducting electrical connection between electrodes to be inspected of a circuit device, which is an object of inspection, and inspection electrodes of a circuit board for inspection by being intervened between the circuit device and the circuit board for inspection, wherein a reinforcing material formed of insulating mesh or nonwoven fabric is contained in a surface layer portion, with which the circuit device comes into contact, on one surface side of the anisotropically conductive film.

4. The anisotropically conductive connector according to claim 3, wherein second particles exhibiting neither conductivity nor magnetism are contained in the surface layer portion, with which the circuit device comes into contact, on one surface side of the anisotropically conductive film.

5. The anisotropically conductive connector according to claim 4, wherein the second particles exhibiting neither conductivity nor magnetism are diamond powder.

6. The anisotropically conductive connector according to claim 3, wherein conductive path-forming parts, which are not electrically connected to the electrodes to be inspected of the circuit device that is the object of inspection, are formed in the anisotropically conductive film in addition to the conductive path-forming parts electrically connected to the electrodes to be inspected.

7. The anisotropically conductive connector according to claim 6, wherein the conductive path-forming parts, which are not electrically connected to the electrodes to be inspected of the circuit device that is the object of inspection, are formed at least at the peripheral edge portion of the anisotropically conductive film supported by the supporting body.

8. The anisotropically conductive connector according to claim 6, wherein the conductive path-forming parts are arranged at a fixed pitch.

9. A process for producing an anisotropically conductive connector having an anisotropically conductive film, in which a plurality of conductive path-forming parts each extending in a thickness-wise direction of the film are arranged in a state mutually insulated by insulating parts, which comprises:

providing a mold for molding the anisotropically conductive film, the molding cavity of which is formed by a pair of faces, forming, on a molding surface of one face a molding material layer obtained by incorporating a reinforcing material formed of insulating mesh or nonwoven fabric and conductive particles exhibiting magnetism into a liquid polymeric substance-forming material, which will become an elastic polymeric substance by curing, and moreover forming, on a molding surface of the other face, a molding material layer obtained by incorporating conductive particles into a liquid polymeric substance-forming material, which will become an elastic polymeric substance by curing, and stacking the molding material layer formed on the molding surface of said one face and the molding material layer formed on the molding surface of the other face, thereafter applying a magnetic field having an intensity distribution to the thickness-wise directions of the respective molding material layers, and subjecting the molding material layers to a curing treatment, thereby forming the anisotropically conductive film.

10. An inspection apparatus for circuit devices, comprising a circuit board for inspection having inspection electrodes arranged correspondingly to electrodes to be inspected of a circuit device, which is an object of inspection, and the anisotropically conductive connector according to claim 3, which is arranged on the circuit board for inspection.

11. The inspection apparatus for circuit devices according to claim 10, wherein a pressurizing force-relaxing frame for relaxing the pressurizing force of the electrodes to be inspected against the anisotropically conductive film of the anisotropically conductive connector is arranged between the circuit device, which is the object of inspection, and the anisotropically conductive connector.

12. The inspection apparatus for circuit devices according to claim 11, wherein the pressurizing force-relaxing frame has spring elasticity or rubber elasticity.

* * * * *